United States Patent
Ohta et al.

(10) Patent No.: US 6,922,454 B2
(45) Date of Patent: Jul. 26, 2005

(54) DIRECT CONVERSION RADIO RECEIVING SYSTEM USING DIGITAL SIGNAL PROCESSING FOR CHANNEL FILTERING AND DOWN CONVERSION TO BASE BAND

(75) Inventors: Gen-ichiro Ohta, Kanagawa (JP); Kazunori Inogai, Kanagawa (JP); Hiroaki Sudo, Kanagawa (JP); Fujio Sasaki, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/278,540

(22) Filed: Oct. 23, 2002

(65) Prior Publication Data

US 2003/0058976 A1 Mar. 27, 2003

Related U.S. Application Data

(62) Division of application No. 09/075,884, filed on May 11, 1998, now Pat. No. 6,584,305.

(30) Foreign Application Priority Data

May 13, 1997 (JP) .............................. 9-137424

(51) Int. Cl.[7] .................................... H04B 1/10
(52) U.S. Cl. ...................... 375/350; 455/213
(58) Field of Search .................. 375/147, 141, 375/350

(56) References Cited

U.S. PATENT DOCUMENTS

| | | | |
|---|---|---|---|
| 4,184,174 A | * 1/1980 | Aschwanden | 348/665 |
| 4,733,403 A | * 3/1988 | Simone | 375/350 |
| 4,862,168 A | 8/1989 | Beard | 341/140 |
| 4,893,316 A | 1/1990 | Janc | 375/44 |
| 5,142,286 A | 8/1992 | Ribner | 341/143 |
| 5,230,011 A | * 7/1993 | Gielis et al. | 375/344 |
| 5,375,146 A | 12/1994 | Chalmers | 375/103 |
| 5,386,239 A | 1/1995 | Wang | 348/472 |
| 5,473,280 A | 12/1995 | Ohnishi | 329/304 |
| 5,490,173 A | * 2/1996 | Whikehart et al. | 375/316 |
| 5,715,281 A | * 2/1998 | Bly et al. | 375/344 |
| 5,809,399 A | 9/1998 | Tuutijarvi | 455/63 |
| 5,828,955 A | 10/1998 | Lipowski et al. | 455/86 |
| 5,835,390 A | * 11/1998 | Trager | 708/313 |
| 5,881,112 A | 3/1999 | Muri | 375/332 |
| 5,896,562 A | 4/1999 | Heinonen | 455/76 |
| 5,926,513 A | 7/1999 | Suominen | 375/346 |
| 6,104,764 A | * 8/2000 | Ohta et al. | 375/332 |
| 6,111,911 A | * 8/2000 | Sanderford et al. | 375/147 |

FOREIGN PATENT DOCUMENTS

| | | |
|---|---|---|
| DE | 3541031 A1 | 5/1986 |
| JP | HEI. 6-164243 | 6/1994 |
| JP | HEI. 9-266452 | 10/1997 |
| WO | WO 96/08078 | 3/1996 |
| WO | WO 96/11527 | 4/1996 |

* cited by examiner

*Primary Examiner*—Stephen Chin
*Assistant Examiner*—Harry Vartanian
(74) *Attorney, Agent, or Firm*—Pearne & Gordon LLP

(57) ABSTRACT

A radio receiving system, which receives an input signal in a direct conversion receiving mode through the use of a plurality of cascaded channel filters, each including a complex coefficient filter, to obtain a desired waveform, wherein a center frequency of a preliminary channel filter corresponds more closely with the frequency of the desired waveform than a center frequency of a subsequent channel filter.

8 Claims, 25 Drawing Sheets

FIRST ADJACENT WAVEFORM ELIMINATION FILTER

SECOND ADJACENT WAVEFORM ELIMINATION FILTER

THIRD ADJACENT WAVEFORM ELIMINATION FILTER

PRIOR ART

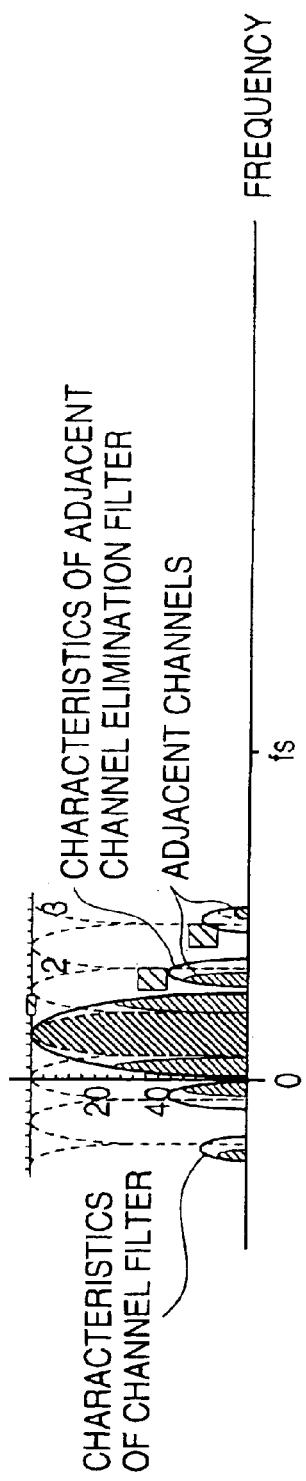
FIG. 10C  DESIRED WAVEFORM OUTPUT/CHANNEL FILTER
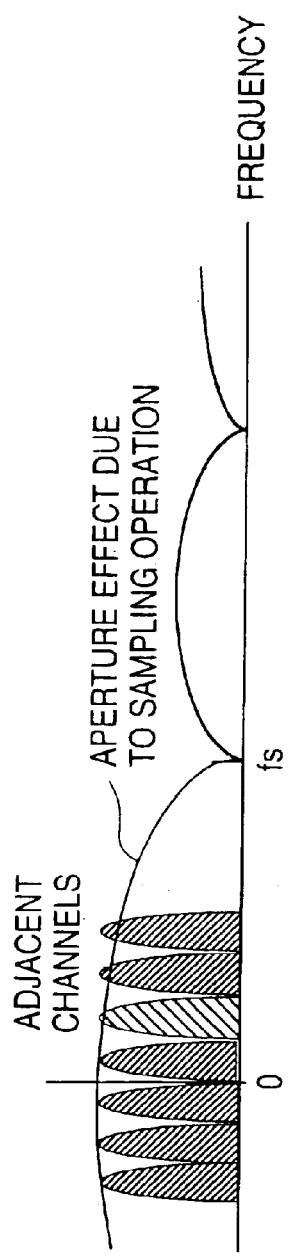
FIG. 10D  INFLUENCE OF APERTURE EFFECT DUE TO SAMPLING OPERATION

FIG. 11
DC COMPONENT SEPARATION CIRCUIT SHOWN IN FIG. 1 OR 2
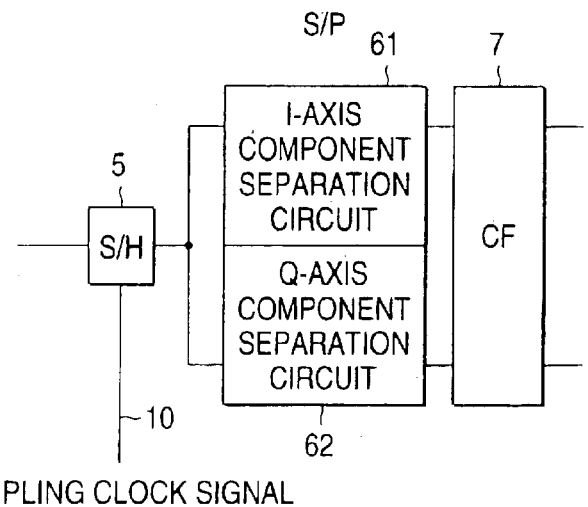
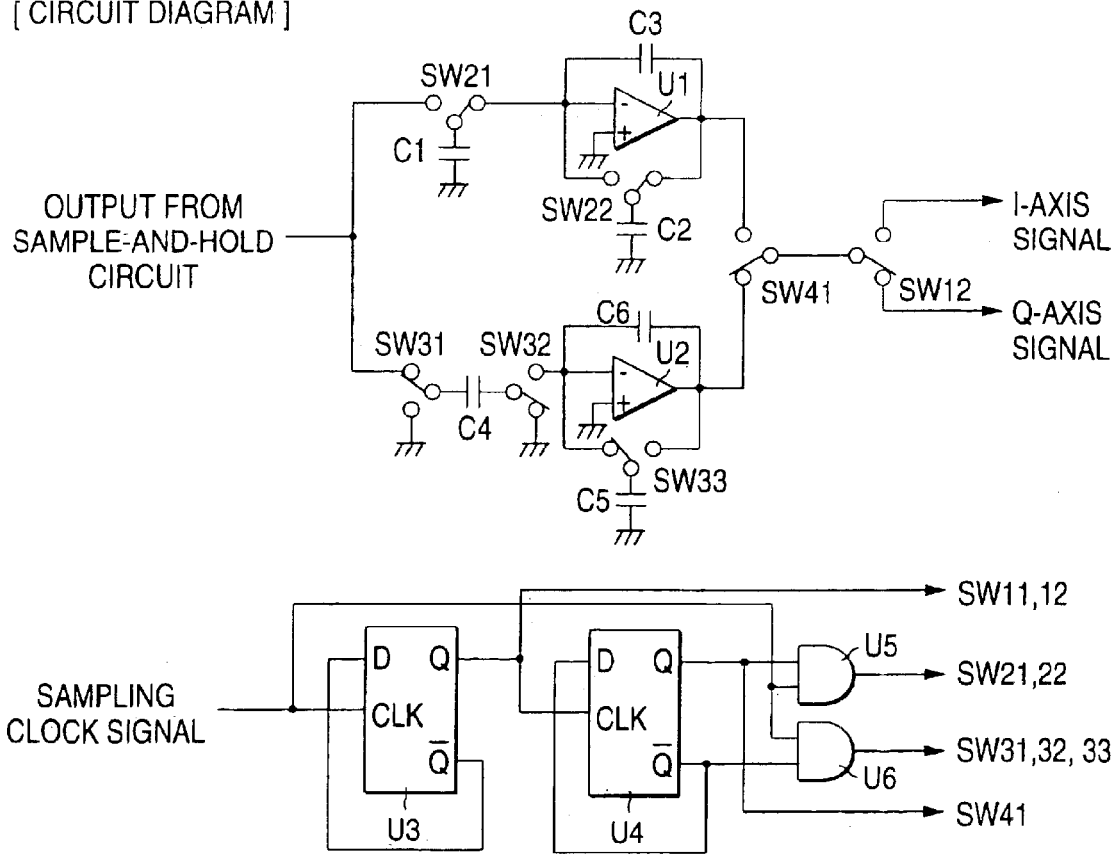

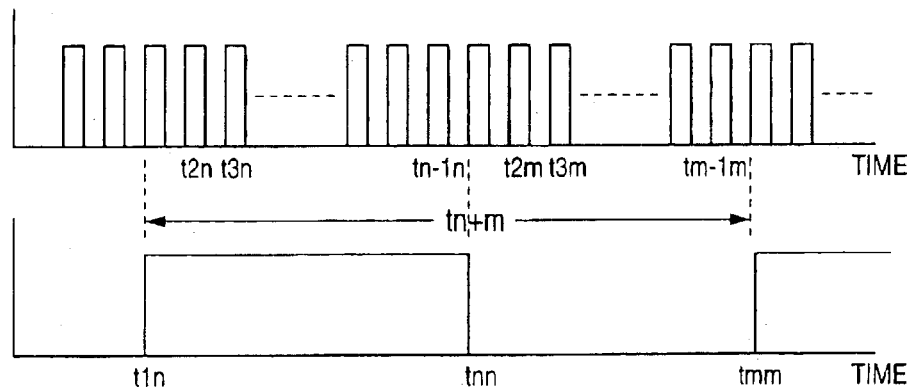
FIG. 21A
FIG. 21B
FIG. 22
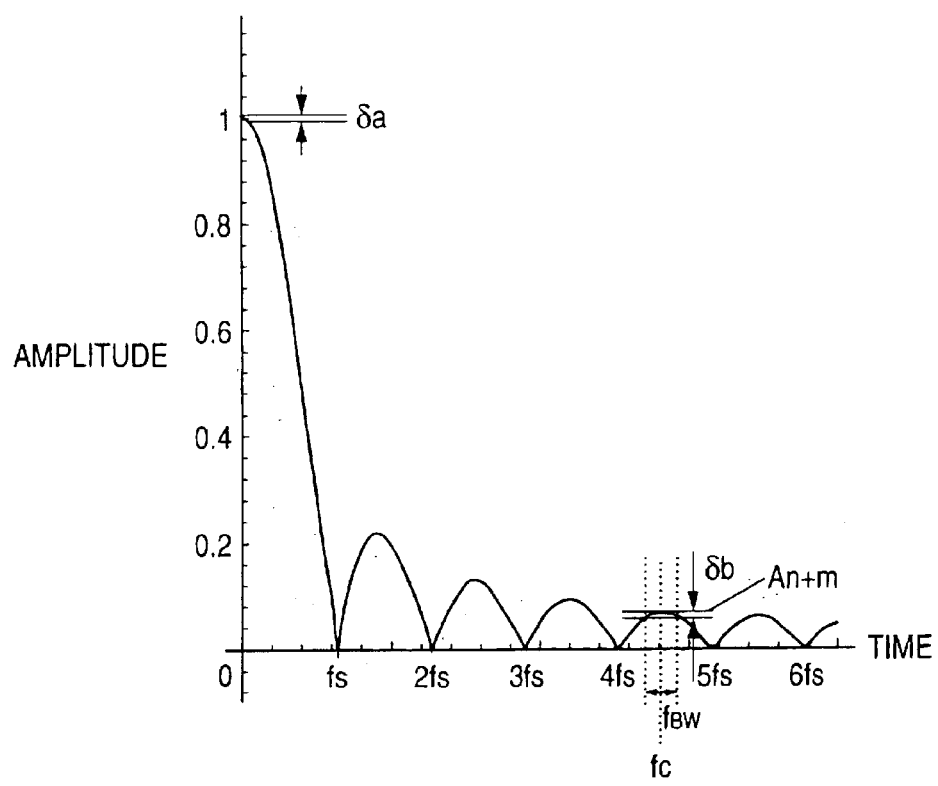

EXPLANATORY DIAGRAM RELATING TO OCCURRENCE OF ERROR IN CAPACITANCE OF CAPACITOR
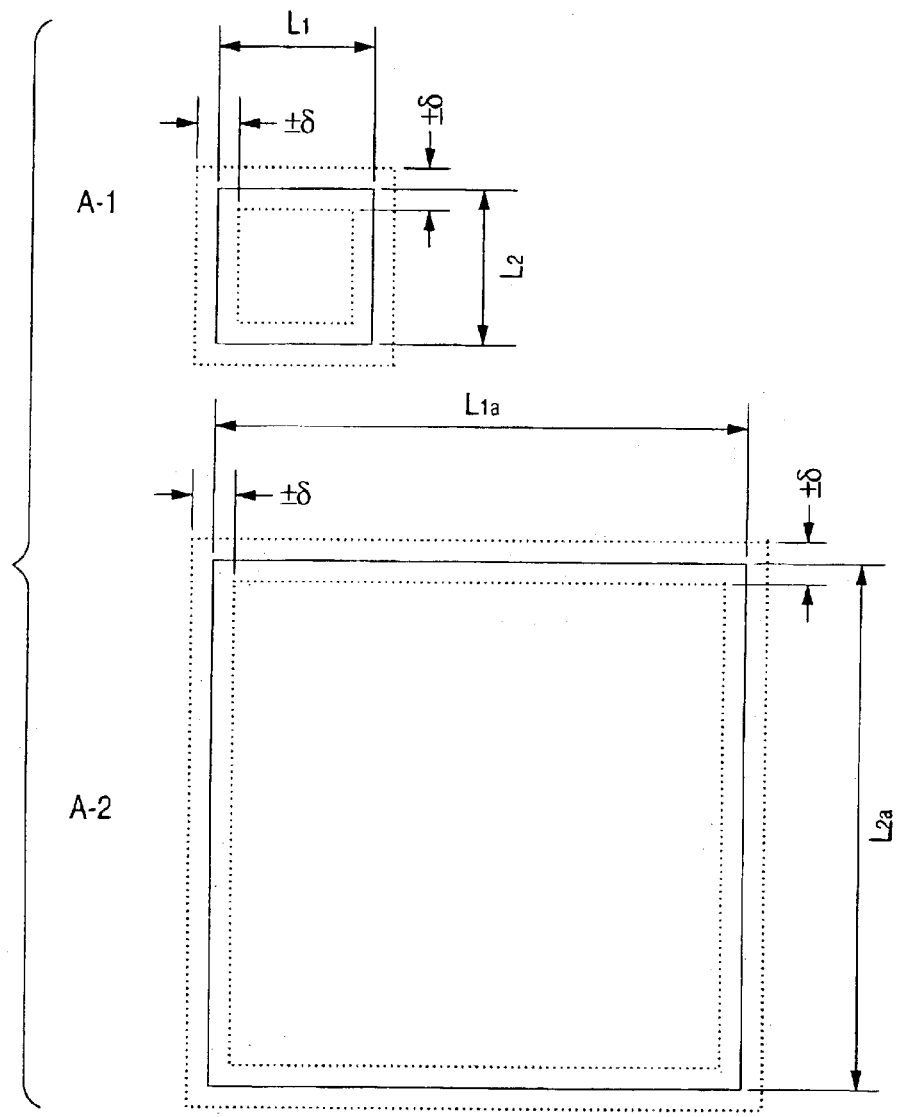
FIG. 26A
PRINCIPLE OF THE PRESENT INVENTION
FIG. 26B
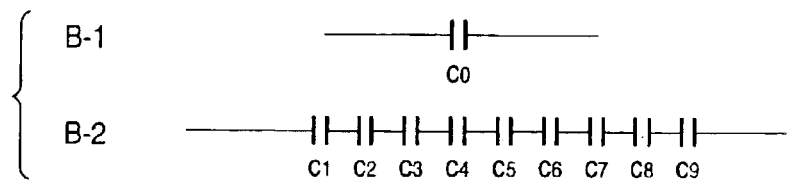

DIRECT CONVERSION RADIO RECEIVING SYSTEM USING DIGITAL SIGNAL PROCESSING FOR CHANNEL FILTERING AND DOWN CONVERSION TO BASE BAND

CROSS-REFERENCE TO RELATED APPLICATIONS

This application is a divisional of application Ser. No. 09/075,884 filed on May 11, 1998 now U.S. Pat. No. 6,584,305 which claims priority from Japanese application No. HEI 9-137424, filed on May 13, 1997, and both incorporated herein by reference.

BACKGROUND OF THE INVENTION

1. Field of the Invention

The present invention relates to a radio receiving system based on an orthogonal modulation communication method, and more particularly, to a radio receiving system which compensates for an aperture effect due to a sampling operation by setting the frequency characteristics of a band pass filter—which permits passage of only a signal at a frequency band assigned to a communications system from which the radio receiving system receives a signal—are set so as to prevent the aperture effect.

2. Description of the Related Art

A receiver—which is based on a direct conversion receiving method and which has a simplified radio section—is realized through use of a channel filter which samples, or subjects to an analog-to-digital conversion operation, an input signal while the input signal still remains in a high frequency state before converted into a baseband signal and which subjects the quantized signal to a stable digital signal processing operation having a high degree of accuracy. However, the channel filter suffers from the following four problems.

First, as a result of the sampling operation, the sampling frequency renders the frequency characteristics of the overall radio receiving system uneven. Consequently, a digitized signal is demodulated at a high error rate.

Second, in order to highly accurately perform a sampling operation, previous and subsequent stages of the sampling circuit must have high speed characteristics required to ensure over a considerably wide frequency range the speed performance of the sampling circuit for the purpose of preventing the aperture effect. As a result, the sampling circuit has a bandwidth which is considerably wider than the bandwidth of a received signal. In short, in spite of a band pass filter provided in a previous stage in order to limit the bandwidth of the received signal to a predetermined bandwidth, the circuit provided in the subsequent stage must have a bandwidth which is significantly wider than that of the band pass filter. Thermal noise caused by the circuit provided in the subsequent stage exceeds the amount of that caused in an existing radio receiving system, which also accounts for an increase in the error rate.

Third, under the direct conversion receiving method, there is a need to provide a base band circuit with a function as a substitute for a channel filter which is conventionally provided in an IF stage of the existing receiver. To this end, it is also necessary for an HF stage whose filtering is insufficient to maintain a wide dynamic range and a wide bandwidth. Still further, there is a need for a filter which filters a signal having such a wide dynamic range and a bandwidth.

Fourth, a sampled signal usually includes d.c. components. Since the signal becomes vulnerable to d.c. noise, drift, or offsets, the signal including such noise accounts for a large error rate in the case of a portable cellular phone based on digital modulation.

FIG. 9 shows an example of an existing direct conversion receiver which uses a bandwidth-limited sampling method. This circuit diagram corresponds to a direct IF sampling circuit used in a new produce "125 MSPS Monolithic Sampling Amplifier AD9101" described in "*Analog Devises Converter Data Book*," 1$^{st}$ edition, Analog Devises Co., Ltd., July, 1997. There are descriptions which state "Adoption of the Nyquist theory enables elimination of an IF frequency and reconstruction of a base band signal. For example, a 40-MHz IF signal is modulated by a signal having a bandwidth of 10 MHz, and a signal to be detected is detected at a sampling rate of 25 MSPS." A 40-MHz IF signal modulated by a signal having a bandwidth of 10 MHz is usually detected at a sampling frequency which is twice as high as a frequency of 40 MHz. However, since the signal is limited to a bandwidth of 10 MHz, the IF signal can be detected at a sampling frequency of 25 MHz by utilization of the "Shannon's Sampling Theorem" according to which the IF signal can be sampled at a frequency twice or more as high as a frequency of 10 MHz.

FIGS. 10A to 10D are views showing variations in spectral components when direct conversion reception is performed through a bandwidth-limited sampling operation. FIG. 10A shows a desired waveform and adjacent waveforms in a radio frequency band, as well as the characteristics of a band pass filter which covers these waveforms. In the drawing, fs designates a sampling frequency set to a frequency which is twice or more as wide as a communications bandwidth or a the bandwidth of a bandwidth-limited filter.

FIG. 10B shows spectral components of the desired waveform and adjacent waveforms having frequencies converted into a baseband frequency at a sampling frequency. The baseband frequency range fBB is in principle the same as fBW.

FIG. 10C shows the result of extraction of the desired signal through a channel filtering operation, wherein a quantized signal obtained as a result of a sampling operation is subjected to a digital signal processing operation.

FIG. 10D shows the aperture effect caused by the sampling operation at this time. In other words, the drawing shows spectral components of what-is-called a sampling function. The spectral components have characteristics of $\{\sin(\pi f/fs)\}/(\pi f/fs)$, and a null occurs at a sampling frequency fs. Although the desired waveform in the range less than half the sampling frequency does not occur at the null point, the waveform is given the frequency characteristics which gradually attenuates a waveform toward higher frequencies.

The present invention relates to a receiver circuit having a built-in channel filter which is used with a radio receiving system assigned an offset frequency (disclosed in Japanese Patent Application Laid-open No. Hei-9-266452 "Receiving System" and Japanese Patent Application No. Hei-9-28271 "Receiving System," both being filed by the applicant of the present patent application) and includes a complex coefficient filter. In the channel filter including a complex coefficient filter on which the present invention is based, the center of positive and negative frequency components to be subjected to a complex operation does not necessarily occur at zero frequency. For this reason, the aperture characteristics of the channel filter which cause the center of frequency components to occur at zero frequency make the operation distorted, resulting in a considerable decrease in the accuracy of the operation. Further, even if frequency components are shaped so as to have complete Nyquist characteristics through use of a subsequent root Nyquist filter, the frequency components cannot have the complete Nyquist characteristics.

SUMMARY OF THE INVENTION

The present invention has been conceived to solve the foregoing problem in the existing radio receiving system, and the object of the present invention is to solve the problem by providing characteristics of compensating for the aperture effect due to a sampling operation to a band pass filter disposed in a receiving input stage of a receiver circuit of a radio receiving system, wherein a channel filter is realized by quantizing a received signal through sampling and by subjected the thus-quantized signal to a digitized signal processing operation.

A first aspect of the invention is directed to a radio receiving system in which a channel filter is formed by quantizing a received signal through sampling and by subjecting the thus-quantized signal to a digitized-signal processing operation, wherein a band pass filter having characteristics of compensating for the aperture effect due to a sampling operation is provided in an input receiving stage. Use of the band pass filter having the foregoing characteristics enables compensation for the aperture effect due to the sampling operation.

According to a second aspect of the invention, the radio receiving system is characterized by further comprising: a sample-and-hold circuit for sampling and holding an output from the band pass filter; and an integrating circuit having a function of integrating the received signal during a period of sampling operation of the sample-and-hold circuit. As a result of the radio receiving system being provided with the integration effect, the energy of a desired waveform signal can be integrated. Particularly, even in a case where a weak radio wave is received and a desired waveform signal is buried in thermal noise in a circuit, a sampling operation being performed at an ordinary voltage enables power to be produced from an input signal only during a period over which the aperture effect arises. However, the radio receiving system according to claim 2 has the effect of being able to double the power by integrating the received signal while the period over which the received signal is integrated is extended.

According to a third aspect of the invention, the radio receiving system as defined in the second aspect is characterized by the feature that integral action time of the integrating circuit can be changed or selected from a plurality of values. As a result, the integral action time of the sample-and-hold circuit is changed with respect to a change in the frequency or bandwidth of the input signal, enabling a desired integration effect to be accomplished.

According to a fourth aspect of the invention, the radio receiving system as defined in the third aspect is characterized by the feature that the integral capacity of the integrating circuit is made variable. As a result, the integral action time of the sample-and-hold circuit is changed with respect to a change in the frequency or bandwidth of the input signal, enabling a desired integration effect to be accomplished.

According to a fifth aspect of the invention, the radio receiving system as defined in the second aspect is characterized by the feature an integrating gate function of the integrating circuit is arranged so as to produce a Nyquist signal waveform. As a result, an efficient sample-and-hold circuit can be realized which provides a superior signal-to-noise ratio.

According to a sixth aspect of the invention, the radio receiving system as defined in either second or third aspect is characterized by the feature that the time constant of the sample-and-hold circuit is set so as to become longer than the sampling frequency. As a result, thermal noise or random signals can be sufficiently removed from a lower-frequency component. Further, diminution of the sampling frequency results in a reduction in the power dissipated by the sample-and-hold circuit or by peripheral circuits connected thereto.

According to a seventh aspect of the invention, the radio receiving system as defined in any one of the first to third aspects is characterized by further comprising: sampling means which is made of a sample-and-hold circuit and which samples the received signal; difference calculation means for calculating a difference between a currently-sampled signal received from the sample-and-hold circuit and a previously-sampled signal; and means for calculating a difference between the output from the difference calculation means and an output from the band pass filter and inputs the thus-obtained difference to the sample-and-hold circuit. As a result, the radio receiving system has the effect of being able to prevent originally-undesired components, such as temperature drift of a sampling circuit or d.c. offset of an input circuit, from being mixed into a received signal.

According to an eighth aspect of the invention, the radio receiving system as defined in any one of the first to third aspects is characterized by further comprising: sampling means which is made of a sample-and-hold circuit and which samples the received signal; Hilbert transformation means which produces rectangular components from the sample output from the sample-and-hold circuit; difference calculation means for calculating a difference between one of the rectangular components received from the transformation means and a previously-sampled rectangular component of the same type; and means for calculating a difference between the output from the difference calculation means and an output from the band pass filter and inputs the thus-obtained difference to the sample-and-hold circuit. As a result, the radio receiving system is effective in removing a d.c. component contained in a sample output produced when the sample-and-hold circuit samples a received signal together with d.c. components or originally-unwanted components mixed in the sample output such as temperature drift of the sample-and-hold circuit or d.c. offset of the input circuit.

A ninth aspect of the invention is directed to a radio receiving system which receives a signal in a direct conversion receiving mode through use of a plurality of cascaded channel filters, each including a complex coefficient filter, wherein the accuracy of operation of the preliminary channel filter is improved when compared with that of the subsequent channel filter. As a result, the radio receiving system is capable of more efficiently attenuating an adjacent waveform spaced frequencies away from a desired waveform, as well as of supplying to a filter circuit provided on a subsequent stage a signal of desired waveform from only the vicinity of which adjacent waveform signals of strong level are removed. Accordingly, even if the filter circuit provided on the subsequent stage is manufactured with less precision: that is, the filter circuit having the insufficient capability of removing waveforms of great level adjacent to the desired waveform, the radio receiving system becomes less apt to suffer from problems.

According to a tenth aspect of the invention, the radio receiving system as defined in the ninth aspect is characterized by the feature that, in order to improve the accuracy of operation of the channel filter provided in the previous stage when compared with that of the channel filter provided in the subsequent stage, the capacitance of a capacitor which is a constituent element of the channel filter provided on the subsequent stage is set so that the capacitor can be manufactured with high dimensional precision, and the capacitance of a capacitor which is a constituent element of the channel filter provided on the previous stage is set so as to become smaller than the total capacitance of the previously-described capacitors when they are cascaded. As a result, the precision of the channel filter is improved through use of capacitors having capacitance realized with the highest possible precision. Further, using capacitors having improved dimensional accuracy, a capacitor whose capacitance is smaller than the total capacitance of the capacitors can be realized.

BRIEF DESCRIPTION OF THE DRAWINGS

FIGS. 10A to 10D are explanatory views showing a frequency pattern and the influence of a sampling operation on the frequency pattern in a case where a receiving device uses a channel filter including the complex coefficient filter according to the first embodiment;

FIG. 11 shows specific circuit configurations of orthogonally-modulated waveforms separation circuit which are based on Hilbert transformation and which are common to the embodiments;

FIGS. 21A and 21B are timing charts for explaining the operation of the radio receiving system according to the sixth embodiment;

FIG. 22 is a plot for explaining the principle of the radio receiving system according to the sixth embodiment;

FIG. 26A is a schematic representation for explaining how an error arises in capacitance of a capacitor when it is formed; and FIG. 26B is a schematic representation for explaining how a capacitor used in a tenth embodiment of the present invention is formed.

DETAILED DESCRIPTION OF THE PREFERRED EMBODIMENTS

Preferred embodiments of the present invention will be described by reference to the accompanying drawings.
(First Embodiment)

Figure 1:
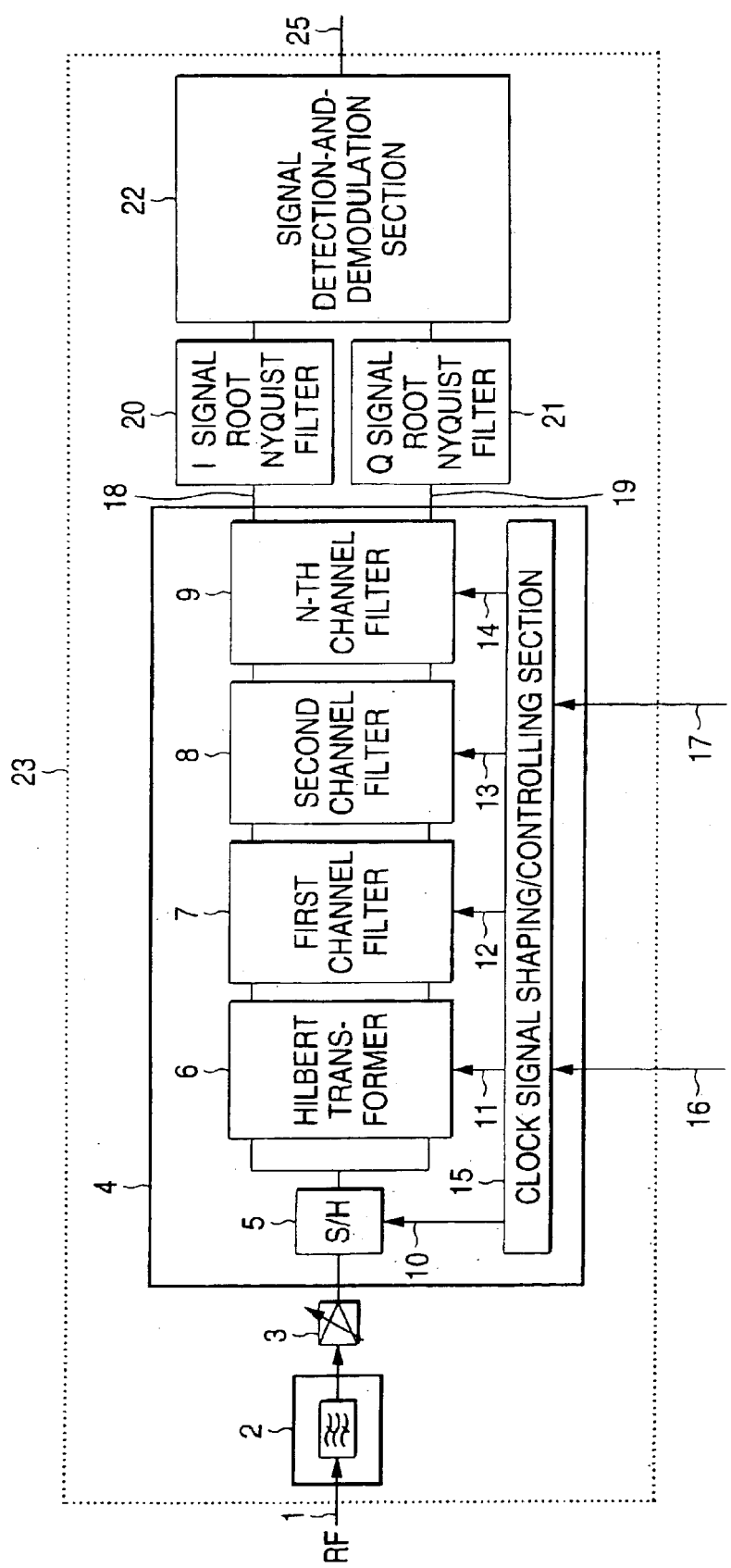
FIG. 1 is a block diagram showing the configuration of a receiver circuit of a radio receiving system according to a first embodiment of the present invention.

FIG. 1 shows a radio receiving system according to a first embodiment of the present invention. A radio receiving system 23 comprises a Q-axis component detection/channel filter section 4, an I signal root Nyquist filter 20; a Q signal root Nyquist filter 21, and a signal detection/demodulation section 22. The Q-axis component detection/channel filter section 4 further includes a first filter 2 which permits passage of only a signal at a frequency band assigned to a communications system from which the radio receiving system receives a signal; a low-noise automatic gain control HF amplifier 3; a sample-and-hold circuit 5; a Hilbert transformer section 6; a first channel filter 7; and a second channel filter 2; an N-th channel filter 9. The receiver circuit 23 receives an input signal 1 from an antenna, a sampling clock signal 10 supplied to the sample-and-hold circuit 5, a clock signal 11 supplied to the Hilbert transformer section 6, a clock signal 12 supplied to the first channel filter 7, a clock signal 13 supplied to the second channel filter 8, a clock signal 14 supplied to the Nth channel filter 9, a reference clock signal 16, and a clock control signal 17.

The operation of the receiver circuit will be described by reference to FIG. 1. The present invention is in principle based on the patent applications (Japanese Patent Application Laid-open No. Hei-9-266452 "Receiving System" and Japanese Patent Application No. Hei-9-28271 "Receiving System," both being filed by the applicant of the present patent application), and hence additional features newly provided for the receiver circuit in the present invention and the principle required by the features will be described.

Turning to FIG. 1, the input signal 1 received from the antenna passes through the first filter 2 which passage of only a signal at a frequency band assigned to a communications system from which the radio receiving system receives a signal. After having been amplified by the low-noise HF amplifier 3, the input signal flows through the sample-and-hold circuit 5, the Hilbert transformer section 6, and a group of channel filters including the first channel filter 7 to the N-th channel filter 9. The Hilbert transformer section 6 and the group of channel filters including the first channel filter 7 to the N-th channel filter 9 receive various types of clock signals 10, 11, 12, 13, and 14 generated by a clock signal generator comprising a clock signal shaping/control section 15 and serve as a channel filter.

An output from the orthogonally-modulated waveform detection/channel filter section 4 is an orthogonally-modulated waveform detection output which is supplied as an I signal output 18 to the I signal root Nyquist filter 20 and as a Q signal output 19 to the Q signal root Nyquist filter 21. After having been shaped so as to have the Nyquist characteristics, these signals are demodulated into a base band signal 25 by means of the signal detection/demodulation section 22.

Figure 12:
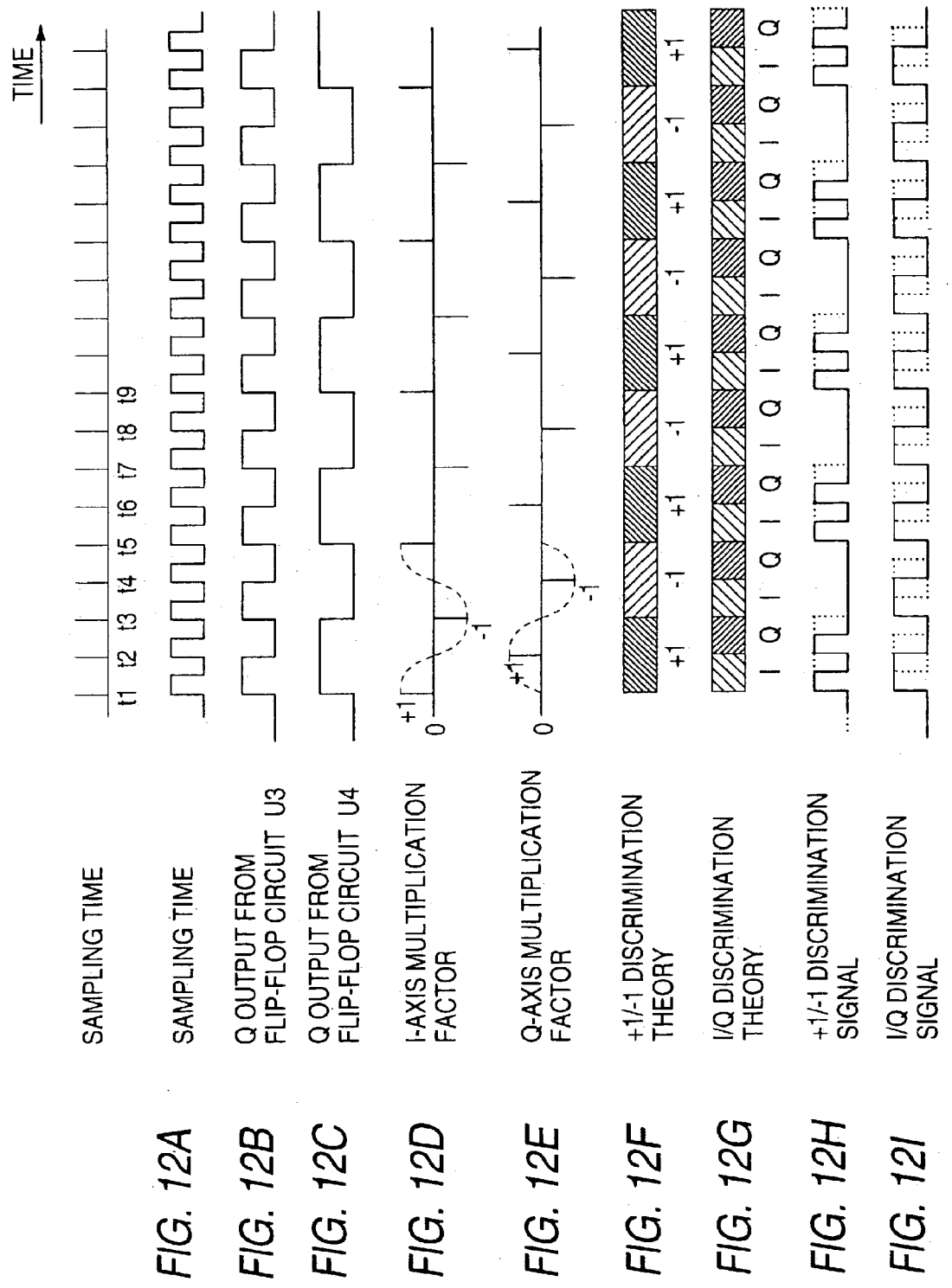
FIGS. 12A to 12I are timing charts showing timing at which the orthogonally-modulated waveforms separation circuit based on Hilbert transformation and common to the embodiments operate.

FIG. 11 shows specific examples of an I-axis component separation circuit 61 and a Q-axis component separation circuit 62 of the Hilbert transformer section 6 shown in FIG. 1, and FIG. 12 shows operations of frequency dividers.

Turning to FIG. 11, the sample-and-hold signal output from the sample-and-hold circuit 5 is supplied to a switch SW21 and a switch SW31. An inverting amplifier U1 serves as a shunt feedback amplifier by means of negative feedback from a capacitor C3. When the switches SW21 and SW22 are in a state such as that shown in FIG. 11, the output from the sample-and-hold circuit 5 is specified by a terminal voltage determined by electric charges stored in the capacitor C1.

When the switches S21 and S22 are inverted as time to, the capacitor C2—which is connected to an output terminal of the inverting amplifier U1 and which is charged by the voltage output from the inverting amplifier so far—is connected to an input terminal of the inverting amplifier U1 by means of the switch SW22. In a case where the capacitor C2 is the same in capacitance as the capacitor C3, the potential of the output voltage of the inverting amplifier U1 is held in the same potential. In the meantime, the switch SW21 connects the output terminal of the sample-and-hold circuit 5 to the capacitor C1, whereby a voltage corresponding to a new sampling value is stored in the capacitor C1.

When the switches SW21 and SW22 again return, at time t1, to the state such as that shown in FIG. 11, the output terminal of the capacitor C1 in which the voltage output from the sample-and-hold circuit 5 is stored is connected to the inverting amplifier U1. If the capacitors C1 and C3 have the same capacitance, a voltage corresponding to a new sampling value is produced at the output terminal of the inverting amplifier U1. In short, the inverting amplifier U1 serves as a buffer amplifier—having the same polarity as that of the sample-and-hold circuit 5—with respect to the output from the sample-and-hold circuit 5.

In contrast, an inverting amplifier U2 serves as a shunt feedback amplifier which receives negative feedback from a capacitor C6. When switches SW32 and SW33 are held in a state such as that shown in FIG. 11, the output from the sample-and-hold circuit is specified by a terminal voltage determined by electric charges stored in the capacitor C5. At this time, a capacitor C4 is charged by the voltage output from the sample-and-hold circuit 5.

When the switches S31 and S32 are inverted as time t0, the capacitor C5—which is connected to an input terminal of the inverting amplifier U2 and which dominates the output voltage of the sample-and-hold circuit 5 so far—is connected to an output terminal of the inverting amplifier U2 by means of the switch SW33. At the same time, the switch SW31 is connected to ground, and the switch SW32 is connected to the input terminal of the inverting amplifier U2. Accordingly, if the capacitors C4 and C6 have the same capacitance, a voltage corresponding to the sampling value output from the sample-and-hold circuit 5 is produced at the output terminal of the inverting amplifier U2. Further, at the same time, since the capacitor C5 is connected to the output terminal of the inverting amplifier U2 by means of the switch SW33, the output from the inverting amplifier U2 is stored in the capacitor C5.

When the switches SW32 and SW33 again return, at time t1, to the state such as that shown in FIG. 11, the output terminal of the capacitor C1 is connected to the input terminal of the inverting amplifier U1, thus holding the potential of the output from the sample-and-hold circuit still further. In short, the inverting amplifier U2 serves as an amplifier which inverts the polarity of the output from the sample-and-hold circuit 5.

A D-type flip-flop U3 receives as an input the sampling clock signal 10, and an inverted output Q is fed back to an input terminal D of the flip-flop, thus constituting a frequency divider. Similarly, a flip-flop U4 also constitutes a frequency divider. As a result of these flip-flops U3 and U4 being cascaded, a frequency passing through these frequency dividers is divided by a factor of four.

The AND gates U5 and U6 receive the outputs of the flip-flops U3 and U4 to output signals to switches SW21, 22 and SW31, 32, 33 for controlling the operation of those switches.

Operations of the frequency dividers will now be described through use of examples of signal operations provided in the operation timing shown in FIG. 12. The sampling clock signal arrives at the frequency dividers at even time intervals: that is, t1, t2, t3, t4, t5, t6, t7, t8, t9, . . . . The waveform of the sampling clock signal is a rectangular waveform having a duty ratio of about 50% as mentioned previously. Upon receipt of such a sampling clock signal, the flip-flop U3 produces a logical 1 as an output Q signal at odd timings t1, t3, t5, t7, . . . . Upon receipt of the outputs from the flip-flip U3, the flip-flop U4 produces a logical 1 as an output Q signal at timing t1, t2, t5, t6, t9, . . .

In order to separate the orthogonally-modulated signal is divided into two signal components in a phase space, all that you have to do is to subject the orthogonally-modulated signal to phase discrimination at the same frequency. An orthogonally-modulated waveform detection operation is equivalent to sampling of a signal with an offset of only π/2. In order to produce the phase-discriminated signals from a series of values sampled through one sampling operation, the orthogonally-modulated signal is subjected to multiplication and discrimination through use of cosine and sine functions.

It is though that if the received signal is sampled at the limit of the sampling frequency, the thus-sampled values correspond to a sampling clock signal having a time interval of π/2 as shown in FIG. 12A. In short, the highest frequency component is sampled through use of four pulses of the sampling clock signal shown in FIG. 12A. At this time, it is only required to simultaneously sample rectangular components while the cosine and sine functions for the purpose of extracting quadrature components are set to a frequency corresponding to the highest frequency.

In short, in a case where a sine waveform whose frequency is a quarter of a cyclic frequency of the sampling clock signal "a" is sampled through use of the sampling clock signal, +1, −1 of the cosine function are sampled at positions such as those shown in FIG. 12D, and +1, −1 of the sine function are sampled at positions which are delayed only π/2 corresponding to one sample relative to those of the cosine function in a manner as shown in FIG. 12E.

Accordingly, I-axis components are obtained by inverting the polarity of the sample signal at the positions shown in FIG. 12D, and Q-axis components are obtained by inverting the polarity of the sample signal at the positions shown in FIG. 12E.

Through the foregoing operations, a sample output signal which is equivalent to that obtained by sampling the orthogonally-modulated signal can be produced from the sample value obtained through a single channel of sampling operations. If the I-axis multiplication factor shown in FIG. 12D and the Q-axis multiplication factor shown in FIG. 12E are divided into group for every segment of the same polarity in order to cause a circuit to perform the foregoing sampling operations, it is apparent from FIG. 12F that a pair is formed every two sampling periods.

Since the I-axis quadrature component and the Q-axis quadrature component are alternately output, they can be illustrated in a manner such as that shown in FIG. 12G. It is obvious that an output from the foregoing cascaded flip-flops is effective in managing such variations in the state of output through use of a circuit.

The basic principle and configuration of the channel filter including the complex coefficient filter are described in the patent applications (Japanese Patent Application Laid-open No. Hei-9-266452 "Receiving System" and Japanese Patent Application No. Hei-9-28271 "Receiving System," both being filed by the applicant of the present patent application). Hence, only the additional features newly provided for the present invention will be explained in detail.

Figure 2:
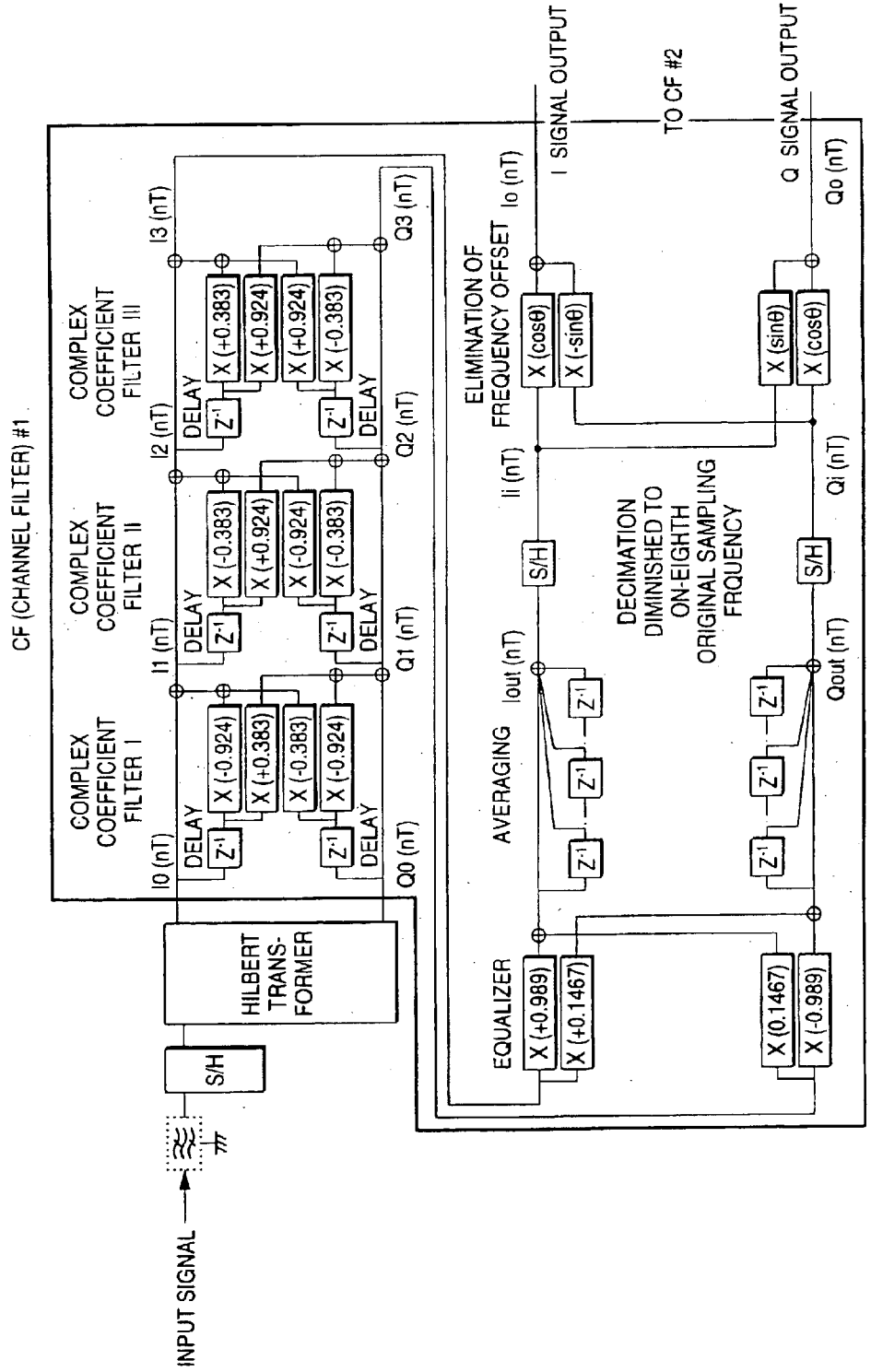
FIG. 2 is a block diagram showing the basic configuration of a channel filter including a complex coefficient filter common to embodiments of the present invention.

FIG. 2 shows the basic configuration of the channel filter including the complex coefficient filter. The drawing is composed of FIGS. 1, 11, 19, 21, 24, 29, and 32A of the specification of the foregoing patent application (Japanese Patent Application Laid-open No. Hei-9-266452 "Receiving System").

Figure 3:
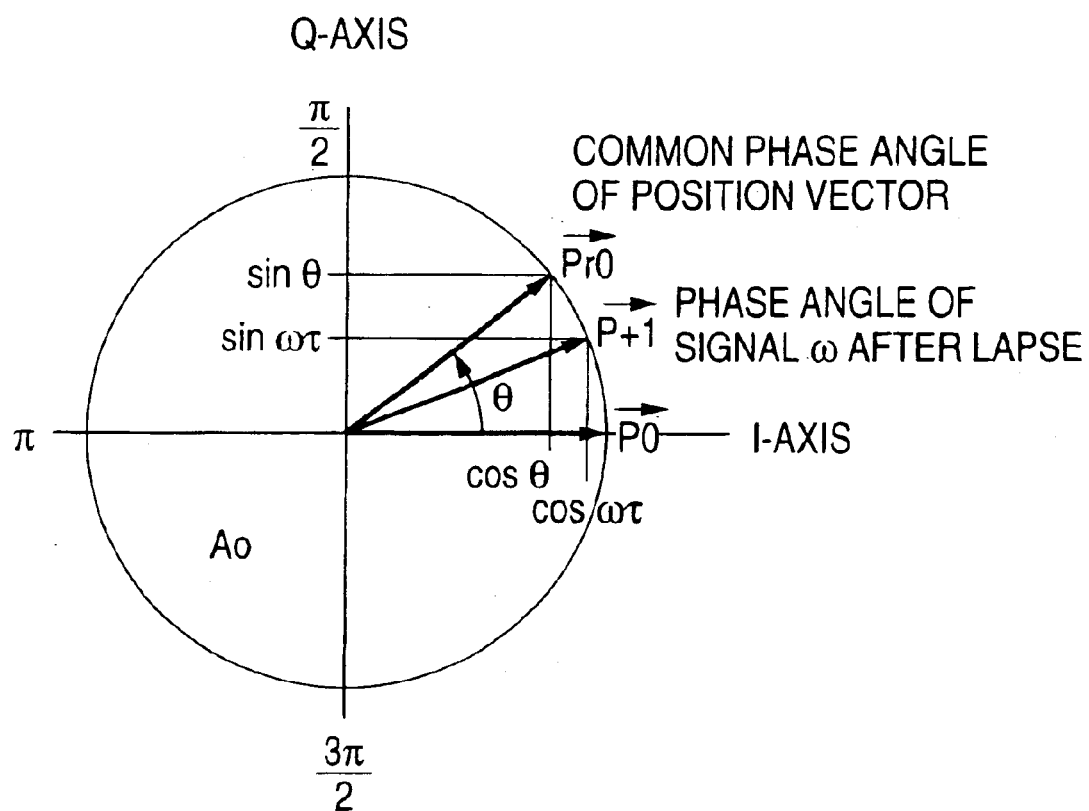
FIG. 3 is a schematic representation for explaining the frequency characteristics of a single-stage complex coefficient filter common to the embodiments.

The theory of frequency characteristics of a three-stage complex coefficient filter—which is the heart of the channel filter shown in FIG. 2—will now be described. FIG. 3 is a view for explaining the frequency characteristics of a single-stage complex coefficient filter. Provided that a signal vector which is rotated and which has amplitude Ao is located at point P0 at time t0 and that a sampling operation is performed at every time τ, the next signal vector P+1 is located at a position shifted from the point P0 by only the product of angular frequency ω and time τ. In contrast, provided that the amount of rotation of a vector for the purpose of eliminating adjacent waveforms is θ, the vector P0 moves to point Pr0 at time t0. An output from the complex coefficient filter corresponds to the sum of the vector P+1 and the vector Pr0. I-axis components and Q-axis components which are the quadrature components of the orthogonally-modulated signal are respectively expressed as follows:

$$Ir(nT)=I(\tau)+Ir=Ao(\cos\omega\tau+\cos\theta)$$

$$Qr(nT)=Q(\tau)+Qr=jAo(\sin\omega\tau-\sin\theta)$$

The frequency characteristics of the resultant vector are expressed by an envelope of the signal vector, i.e., by input power. More specifically, $$Power=|Ir(nT)|^2+|Qr(nT)|^2$$

$$=|Ao(\cos\omega\tau+\cos\theta)|^2+|jAo(\sin\omega\tau-\sin\theta)|^2$$

$$=Ao2\{\cos 2\omega\tau+2\cos\omega\tau\cos\theta+\cos 2\theta\}+Ao2\{\sin 2\omega\tau+2\sin\omega\tau\sin\theta+\sin 2\theta\}$$

$$=Ao2\{\cos 2\omega\tau+\sin 2\omega\tau+\cos 2\theta+\sin 2\theta\}+Ao2\{\cos\omega\tau\cos\theta-2\sin\omega\tau\sin\theta\}$$

$$=2Ao2\{1+\cos(\omega\tau+\theta)\}.$$

The foregoing expression represents that power corresponds to the frequency characteristics of the vector which has the angular frequency ω and which includes sampling interval τ and the amount of rotational phase shift θ. Provided that Ao=1, that the gain of the complex coefficient filter is 1, and that sampling interval τ is 1, a frequency function which uses ω as a variable is shown in FIGS. 4A to 4D.

Figure 4A:
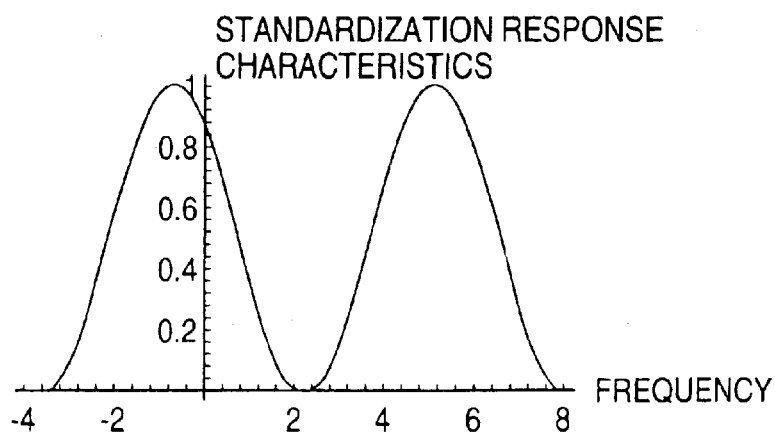
FIGS. 4A to 4D are plots showing the theoretical characteristics values of the basic configuration of the channel filter comprising the complex coefficient filter common to the embodiments.
Figure 4B:
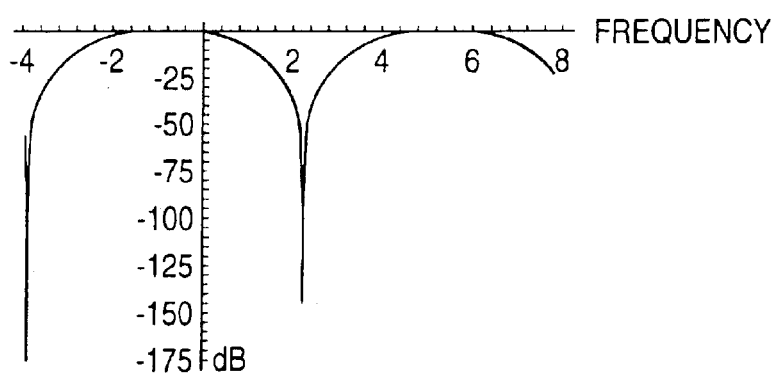
Figure 4C:
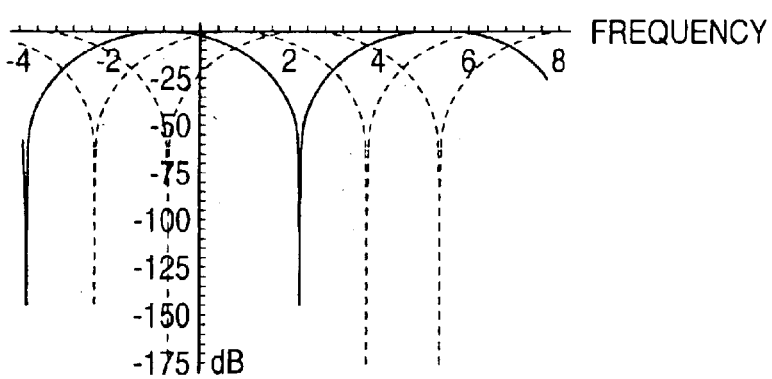
Figure 4D:
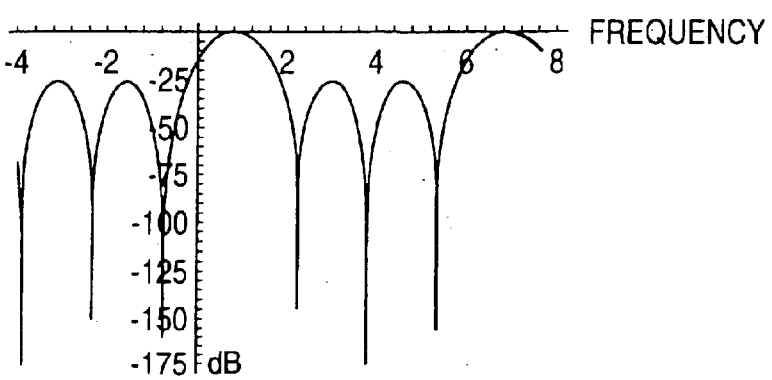

FIG. 4A shows the characteristics of a first-stage complex coefficient filter block shown in FIG. 2, taking the rotation of phase angle of the filter as −π/4. FIG. 4B shows the characteristics expressed in decibels. FIG. 4C shows the characteristics of the complex coefficient filters provided in the first, second, and third stages. These filters rotate a phase angle by −π/4, −2 π/4, and −3 π/4, respectively. FIG. 4D shows the synthetic characteristics of the filters which are shown in FIG. 4C and are cascaded into three stages. The center frequency of one of the adjacent waveforms is attenuated to −125 dB or more. There is also an attenuation of −25 dB in the boundary region between the adjacent waveforms.

As described in the patent application (Japanese Patent Application Laid-open No. Hei-9-266452 "Receiving System"), the foregoing characteristics ensure a filter frequency range of four channels at each of the upper and lower sides of the sampling frequency. Further, a zero frequency of three-stage comb filters—which eliminate waveforms other than a desired waveform through use of an offset frequency corresponding to the baseband frequency at the time of a frequency conversion operation—is placed at the center frequency between adjacent waveforms. More specifically, the channel filter is characterized by being able to ensure four channels between image frequencies by means of the sampling frequency.

Figure 5A:
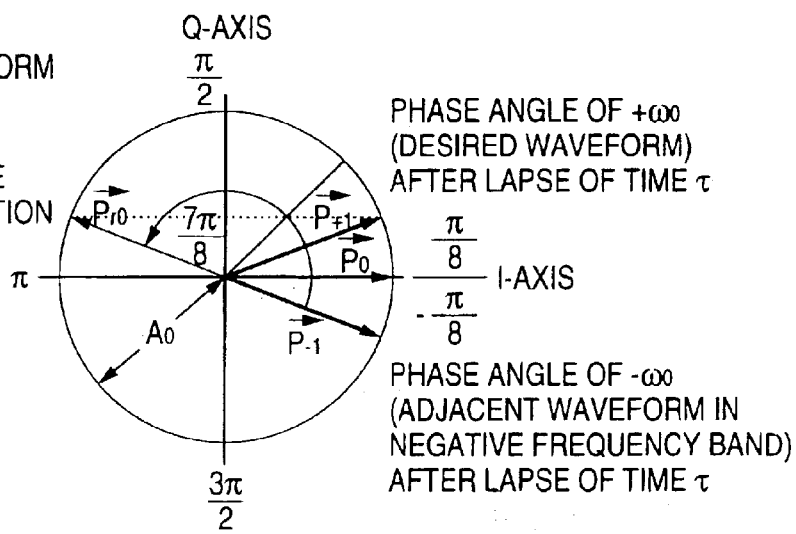
FIGS. 5A to 5C are schematic representations for explaining phase rotations in respective stages of the complex coefficient filter common to the embodiments.

The channel filter is followed by equalizers. The amount of phase compensation required by the equalizer will be theoretically explained by reference to FIGS. 5 and 6. FIG. 5A shows an explanation about the complex coefficient filter I which eliminates the first adjacent waveform. As shown in FIG. 5A, provided that an adjacent waveform in a negative frequency band (−ω0) is placed at position vector Po whose phase is zero, the phase of the waveform shifts clockwise to position vector P-1 by only π/8 after one sampling clock. At this time, in order to produce, from position vector Po, vector Pro which cancels vector position P-1, position vector Po is rotated counterclockwise by only 7 π/8. FIG. 5A will be mathematically expressed by the following equation. It is obvious that the vector Pro is produced by multiplying the vector P0 at time t0 by cos θ and sin θ.

$$Ir(nT)=Ao\_E \cos(-\omega o(t0)+\theta)$$

$$=Ao\_E \cos(-\omega o(t0))\times\cos \theta - Ao\_E \sin(-\omega o(to))\times\sin \theta$$

$$=I0(to)\times\cos \theta - Q0(to)\times\sin \theta$$

$$Qr(nT)=Ao\_E \sin(-\omega o(t0)+\theta)$$

$$=Ao\_E \sin(-\omega o(t0))\times\cos \theta - Ao\_E \cos(-\omega o(to))\times\sin \theta$$

$$Q0(to)\cos \theta + I0(to)\times\sin \theta.$$

Figure 5B:
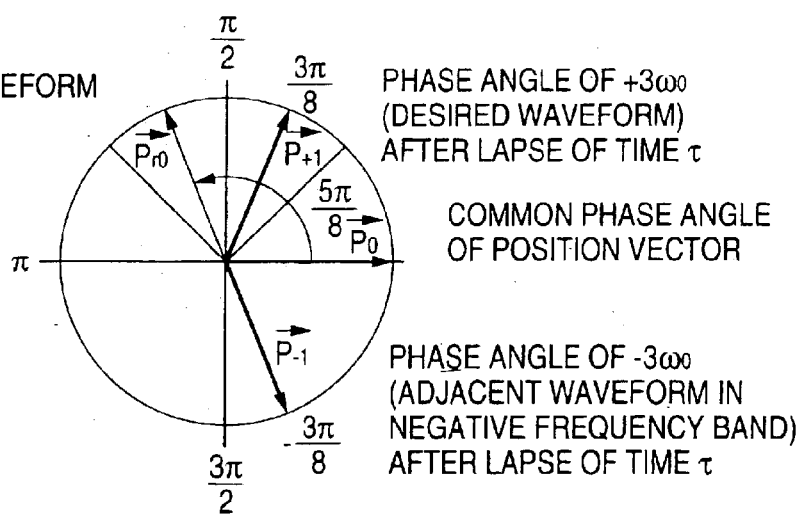
Figure 5C:
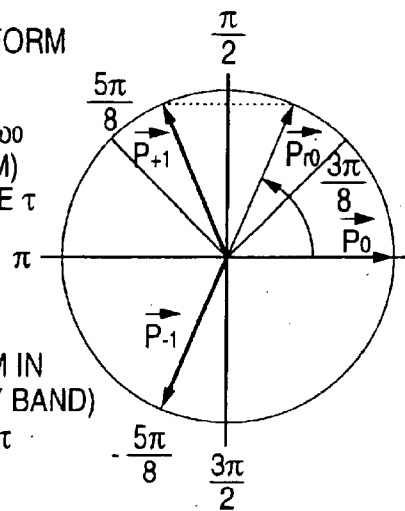

Likewise, FIGS. 5B and 5C show phase rotation angles for the purpose of eliminating adjacent waveforms in the next and third adjacent channels.

A phase rotation angle used for eliminating an adjacent waveform in the next adjacent channel is 5 π/8, and a phase rotation angle used for eliminating an adjacent waveform in the third adjacent channel is 3 π/8.

Figure 6:
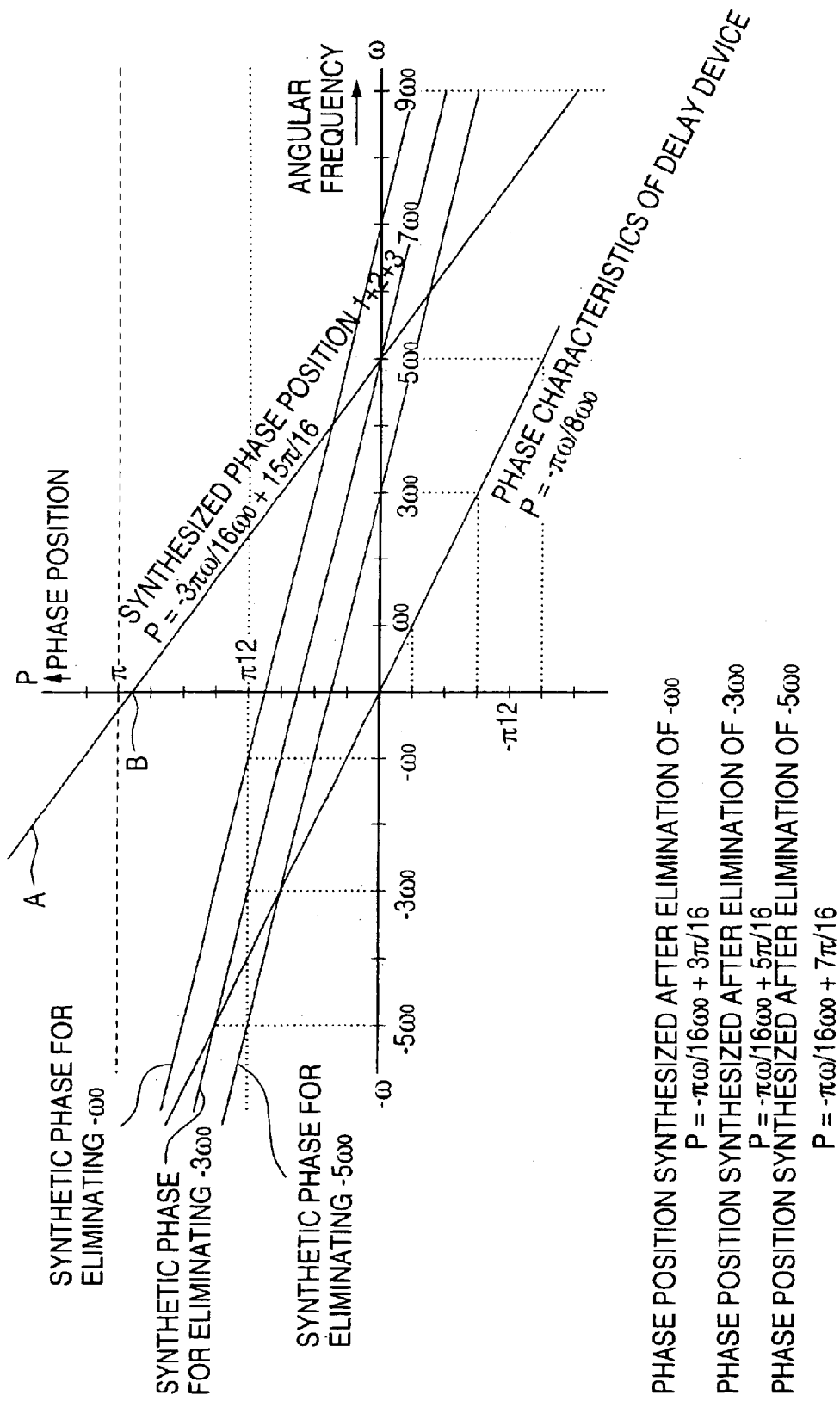
FIG. 6 is a plot showing the relationship between the amount of phase rotation occurring in respective stages of the complex coefficient filter common to the embodiments and a total amount of phase rotation A occurring throughout the channel filter.

As mentioned previously, the phase rotation signifies that the phase characteristics are distorted. FIG. 6 shows phase distortion caused by each of the complex coefficient filters I to III. The phase characteristics of the signal after the signal has passed through the three-stage filter are designated by reference symbol AB shown in FIG. 6. A phase offset value is 15 π/16 represented by point B.

An explanation will now be given of the foregoing descriptions. A null-point of the complex coefficient filter I is set to the center frequency −fb of the adjacent waveform; a null-point of the complex coefficient filter II is set to the center frequency −3 fb of the adjacent waveform; and a null-point of the complex coefficient filter III is set to the center frequency −5 fb of the adjacent waveform. By means of the 16-times oversampling frequency, a variation in phase of the desired waveform corresponding to the period of one sampling time is π/8. A phase difference of −π/8 arises in the adjacent waveform having the center frequency −fb during the period of one sampling time. In order to cancel a currently-sampled signal vector by rotation of a previously-sampled signal vector, the previously-sampled signal vector is rotated by only 7 π/8. At this time, the desired waveform has a phase difference of 6 π/8 relative to the canceled signal vector and hence remains as a vector of 2 sin(π/8). In short, assuming that with an I-axis component of a value sampled at time t0 is expressed as Io and an Q-axis component Of the same is expressed as Qo, rotation of each of the position vectors at time t1 is represented by I-axis Position Vector=$Io\times\cos 7\pi/8 - Qo\times\sin 7\pi/8$ and Q-axis Position Vector=$Io\times\sin 7 \pi/8 + Qo\times\cos 7\pi/8$, respectively.

With regard to a resultant vector which is a sum of a signal vector sampled at time t1 and a vector obtained by rotating the signal vector sampled at the preceding sampling time, an I-axis component output from the complex coefficient filter I is expressed as I1 and an Q-axis component output from the same is expressed as Q1, each being represented by $$I1=Io(t=to+ts)+Io(t=to)\times\cos 7 \pi/8 - Qo(t=to)\times\sin 7 \pi/8 \quad (Eq. 1) \text{ and}$$

$$Q1=Qo(t=to+ts)+Io(t=to)\times\sin 7 \pi/8 + Qo(t=to)\times\cos 7 \pi/8 \quad (Eq. 2),$$

where t and t0 represent time, and ts represents a sampling time interval.

Similarly, the complex coefficient filter II for the purpose of eliminating the adjacent waveform in the next adjacent channel rotates the position vector by 5 π/8, and the complex coefficient filter III for the purpose of eliminating the adjacent waveform in the adjacent channel after the next channel rotates the position vector by 3 π/8. An I-axis component output from the complex coefficient filter II is expressed as I2, and a Q-axis component output from the same as Q2, each of which is represented by $$I2=I1(t=to+ts)+I1(t=to)\times\cos 5 \pi/8 - Q1(t=to)\times\sin 5 \pi/8 \quad (Eq.3), \text{ and}$$

$$Q2=Q1(t=to+ts)+I1(t=to)\times\sin 5 \pi/8 + Q1(t=to)\times\cos 5 \pi/8 \quad (Eq.4).$$

An I-axis component output from the complex coefficient filter III is expressed as I3, and a Q-axis component output from the same as Q3, each of which is represented by $$I3=I2(t=to+ts)+I2(t=to)\times\cos 3 \pi/8 - Q2(t=to)\times\sin 3 \pi/8 \quad (Eq.5) \text{ and}$$

$$Q3=Q2(t=to+ts)+I2(t=to)\times\sin 3 \pi/8 + Q2(t=to)\times\cos 3 \pi/8 \quad (Eq.6).$$

With regard to FIG. 5B, taking the center frequency of the desired waveform as +ωo and the center frequencies of respective adjacent waveforms in the lower adjacent three channels as −ωo, −3ωo, and −5ωo, the phase characteristics P of the complex coefficient filters I, II, and III which eliminate the adjacent waveforms are respectively represented by Complex Coefficient Filter I for eliminating −ωo $$P=-\pi\omega/16\omega o+3 \pi/16$$

Complex Coefficient Filter II for eliminating −3ωo $$P=-\pi\omega/16\omega o+5 \pi/16$$

Complex Coefficient Filter III for eliminating −5ωo $$P=-\pi\omega/16\omega o+7 \pi/16.$$

These phase characteristics of three filters are expressed as three rightwardly-declining parallel lines. The sum of phase characteristics of these three filters is represented by $$P=-3 \pi\omega/16\omega o+15 \pi/16$$

and is designated by line A shown in FIG. 6. An intercept of the line A at ω=0 is represented by point B which corresponds to 15 π/16. As a result, it is obvious that the equalizer is required to cause a phase shift so as to cancel 15 π/16.

It is obvious from FIG. 6 that the phase characteristics of the respective complex coefficient filters I, II, and III are linear. Accordingly, the sum of the characteristics of these filters evidently become linear.

In a case where a plurality of channel filters are connected tandem, the total characteristics of the channel filters are represented by the following equation, and it is obvious that the total characteristics are represented by a linear function with regard to a frequency. More specifically, the phase characteristics of the first-stage channel filter are expressed as $$P1=\{-\pi\omega/16\omega o+3 \pi/16\}+\{-\pi\omega/16 o+5 \pi/16\}+\{-\pi\omega/16\omega o+7 \pi/16\}$$

$$=-3 \pi\omega/16\omega o+15 \pi/16.$$

Assuming that the channel filter in the second stage diminishes the sampling frequency of the sampling clock signal to a quarter of its original frequency, the frequency of the desired waveform on the second stage becomes ωo/4, and hence the phase characteristics P2 of the second-stage channel filter are expressed as $$P2=\{-4\ \pi\omega/16\omega o+3\ \pi/16\}+\{-4\ \pi\omega/16\omega o+5\ \pi/16\}+\{-4\ \pi\omega/16\omega o+7\ \pi/16\}$$

$$=\{-n\ \pi\omega/16\omega o+3\ \pi/16\}+\{-n\ \pi\omega/16\omega o+5\ \pi/16\}+\{-n\ \pi\omega/16\omega o+7\ \pi/16\}$$

$$=-3n\ \pi\omega/16\omega o+15\ \pi/16.$$

The phase characteristics Pn of the n-th channel filter are expressed as $$Pn=\{-4\ \pi\omega/64\omega o+3\ \pi/16\}+\{-4n\ \pi\omega/64\omega o+5\ \pi/16\}+\{-4\ \pi\omega/64\omega o+7\ \pi/16\}$$

$$=\{-n\ \pi\omega/16\omega o+3\ \pi/16\}+\{-n\ \pi\omega/16\omega o+5\ \pi/16\}+\{-n\ \pi\omega/16\omega o+7\ \pi/16\}$$

$$=-3n\ \pi\omega/16\omega o+15\ \pi/16.$$

Accordingly, the total characteristics Ptotal of the n-th stage channel filter are represented by $$P\text{total}=\Sigma n\ i=1\ (-3i\ \pi\omega/16\omega o+15\ \pi/16)$$

$$=-3n(n-1)\pi\omega/32\omega o+15n\ \pi/16.$$

From the foregoing explanations, it is obvious that the phase characteristics are represented by a linear function with regard to frequency ω.

Consequently, it is obvious that the equalizer compensates for the distortion of phase characteristics by rotating the signal vector by 15n π/16.

<Channel Filters Connected Tandem>

In a case where a plurality of channel filters, each including the foregoing complex coefficient filter, are connected tandem, it is evident that diminishing of the sampling frequency to a quarter of its original frequency enables realization of a very efficient filter having superior symmetry in terms of frequency characteristics.

Figure 7A:
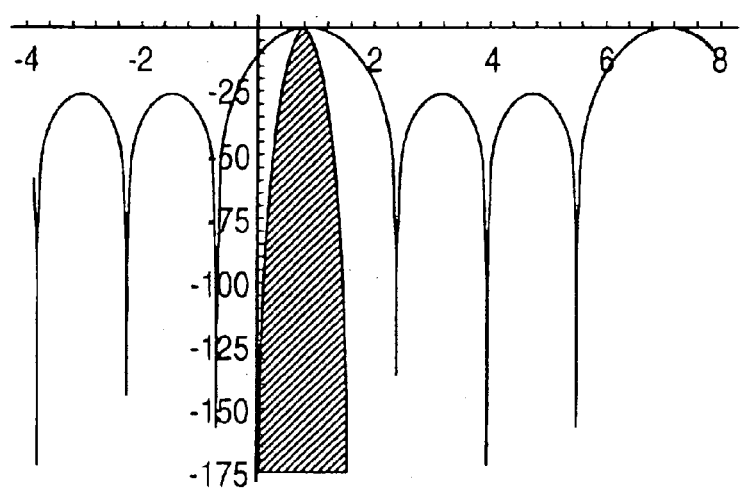
FIGS. 7A to 7C are plots showing the general frequency characteristics of two cascaded channel filters, each of which includes the complex coefficient filter common to the embodiments, wherein when a sampling frequency of a channel filter provided in a subsequent stage is diminished to one quarter the original frequency.
Figure 7B:
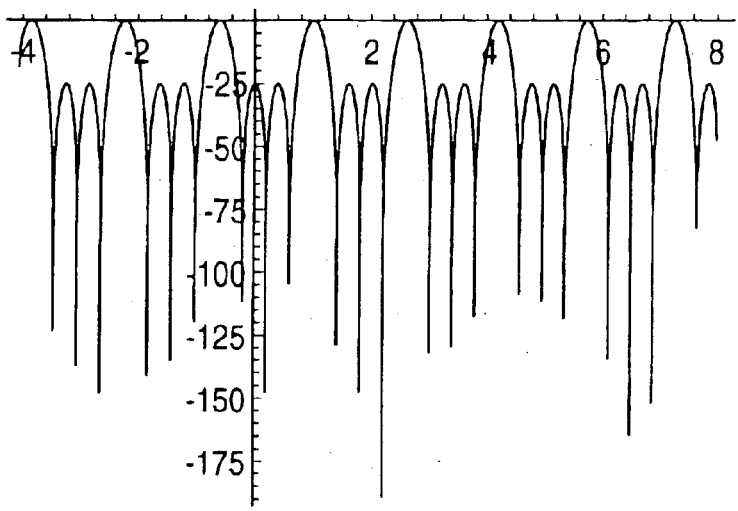
Figure 7C:
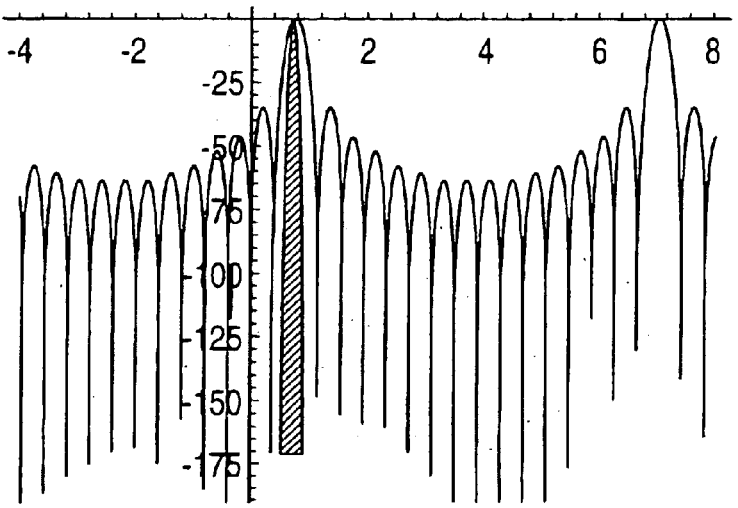

FIGS. 7A to 7C show the theoretical characteristics of the channel filters when two channel filters are connected tandem.

FIG. 7A shows the frequency characteristics of the channel filter shown in FIG. 2 when it is activated at an oversampling frequency which is 64 times as wide as the frequency bandwidth of the channel filter. FIG. 7B shows the frequency characteristics of the channel filter when it is activated in the same manner as that shown in FIG. 4B at an oversampling frequency which is 16 times as wide as the frequency bandwidth of the channel. FIG. 7C shows the total characteristics of these two filters having the foregoing characteristics. It is obvious from FIG. 7C that 16 channels are contained between the sampling waveforms. The signal passing through the boundary region between the next adjacent waveform and the adjacent waveform after the next is attenuated to −30 dB, and the signal passing through the boundary region between the seventh adjacent waveform and the eighth adjacent waveform is attenuated to −60 dB or more. As a matter of course, a null point arises in the filter at the center frequency of the adjacent waveform, and there arises an attenuation of −125 dB or more.

<Elimination of a Frequency Offset>

Figure 8:
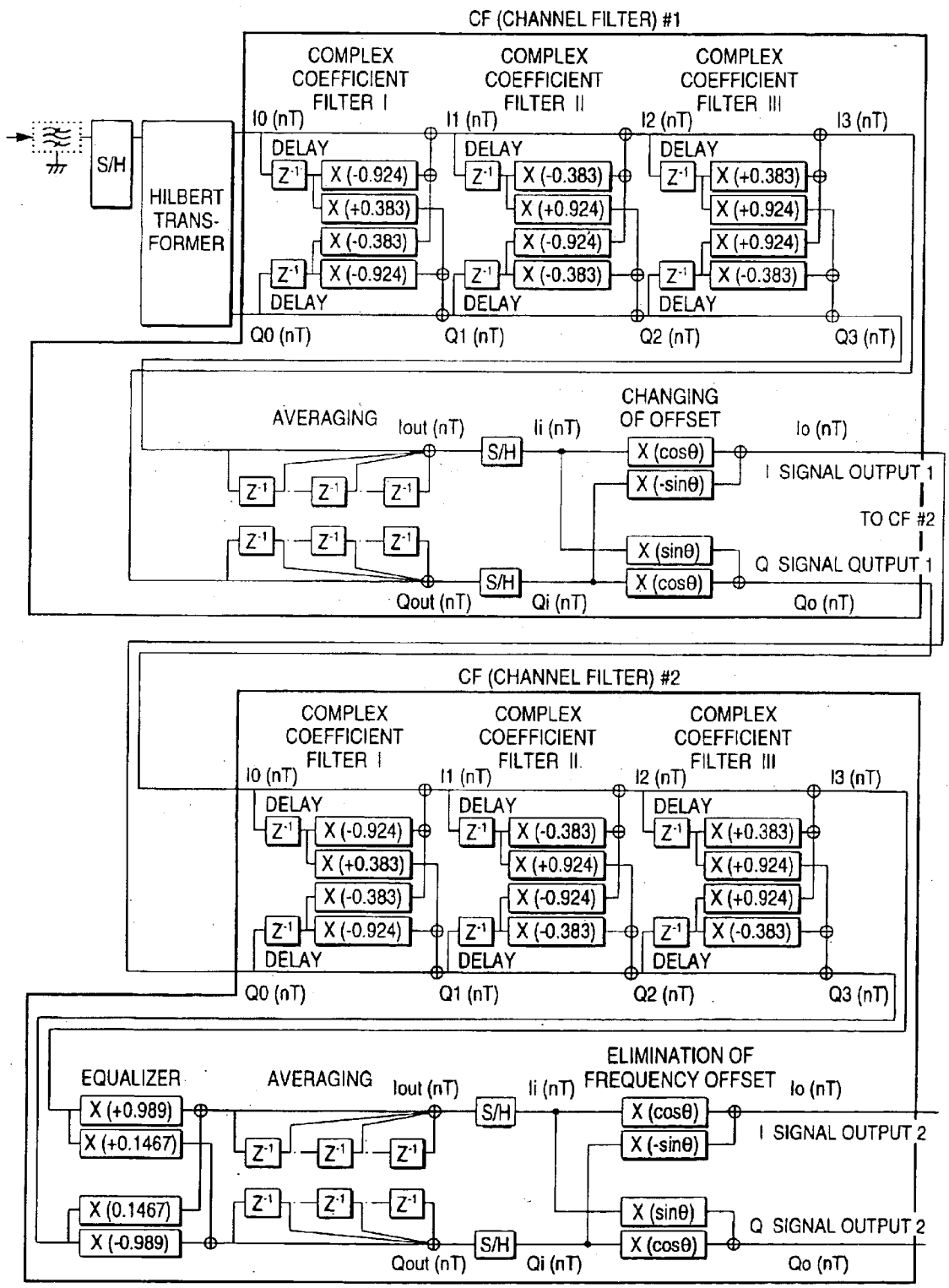
FIG. 8 is a block diagram showing a specific configuration of the two cascaded channel filters, each including the complex coefficient filer common to the embodiments.

FIG. 8 shows a specific example in which the channel filters, each including a complex coefficient filter, are connected tandem. In FIG. 8, an input signal enters the band pass filter, and a desired band component is output. The thus-output signal is sampled at the frequency of the sampling clock signal in the sample-and-hold circuit. An output from the sample-and-hold circuit is separated into quadrature components by the Hilbert transformer section. The quadrature components are delivered to the channel filters 1 and 2 connected tandem.

In the channel filter 1, the quadrature components pass through the complex coefficient filters I, II, and III, thus permitting passage of a desired band component. Errors in rotation of phase of the quadrature components caused by the complex coefficient filters are compensated by the equalizers provided in a subsequent stage. The quadrature components pass through averaging circuits which act as low pass filters for eliminating repeated noise in a high frequency range, entering frequency dividers or sample-and-hold circuits which convert the sampling frequency to a lower sampling frequency required by the channel filter 2 provided in a subsequent stage. Subsequently, the offset frequency of the quadrature components is changed. The offset frequency of the quadrature components must be maintained at the same frequency even after the components having finished undergoing the frequency dividing operation.

As shown in FIG. 7A, a desired waveform is assigned a frequency offset which is half the bandwidth of the desired waveform or is a quarter of the pass bandwidth of the channel filter 1. If the sampling frequency is diminished and supplied to the channel filter 2, the frequency offset is reduced to a quarter of the pass bandwidth determined by the channel filter 2. As a result, a discrepancy arises between the center frequencies of the pass bandwidths shown in FIGS. 7A and 7B. To prevent such a discrepancy, a frequency offset circuit is provided at the end of the channel filter 1.

The outputs from the channel filter 1 are supplied to the channel filter 2. The channel filter 2 is the same in operation and configuration as the channel filter 1, except that the sampling frequency used in the channel filter 2 is different from that used in the channel filter 1. Filtering effect such as that shown in FIG. 7B is obtained.

Accordingly, the multiband receiving filter shown in FIG. 8 exhibits the total characteristic such as that shown in FIG. 7C. The frequency offsets added to the quadrature components so far are eliminated by a frequency offset circuit provided at the end of the channel filter 2, and I and Q signals are output as complete baseband signals.

Figure 10A:
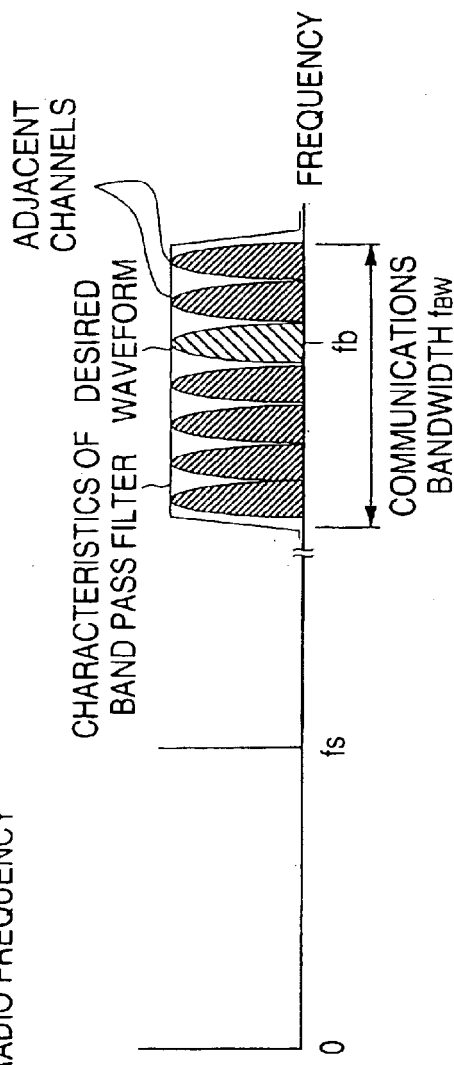
Figure 10B:
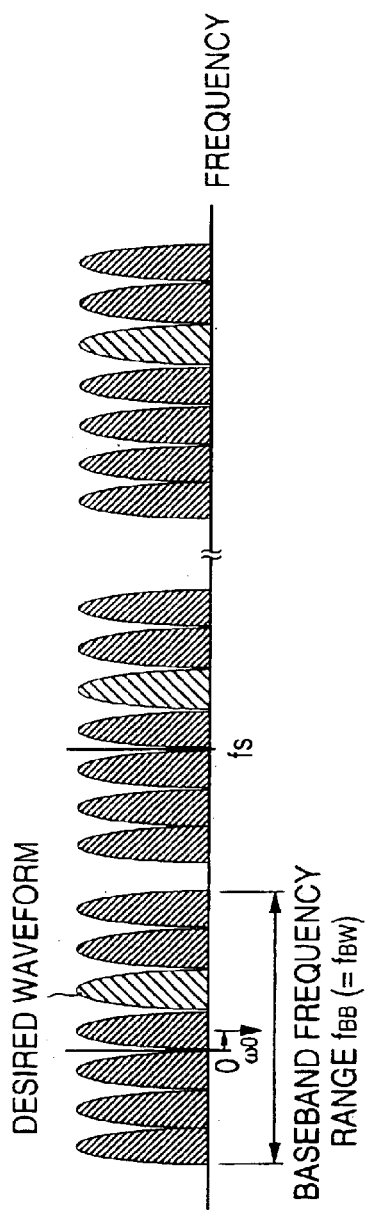

From the foregoing descriptions, the theory underlying the first embodiment of the present invention becomes obvious. The first embodiment will further be described. FIG. 10D shows the influence of an aperture effect due to a sampling operation, i.e., the spectral characteristics of the sampling operation $\{\sin(\pi f/fs)\}/(\pi f/fs)$, on the synthetic characteristics of the three-stage filters shown in FIG. 4C or the characteristics of the multiband receiving filter shown in FIG. 7C.

Figure 15:
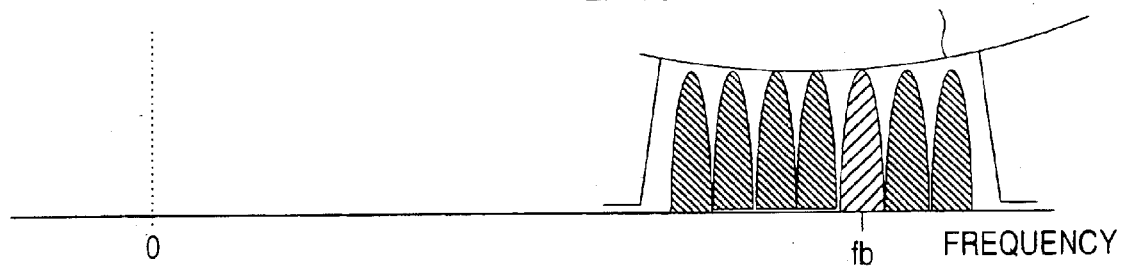
FIG. 15 is a view showing the characteristics of a band pass filter which compensates for the aperture effect due to a sampling operation.

To prevent the influence of the aperture effect, the frequency characteristics of the first filter (i.e., a band pass filter) 2—for the purpose of permitting passage of only a signal at a frequency band assigned to a communications system from which the radio receiving system according to the first embodiment receives a signal—are set so as to become opposite to the aperture effect due to a sampling operation in a manner such as that shown in FIG. 15. The band pass filter having such characteristics can be readily realized through use of a SAW (surface acoustic wave) filter.

(Second Embodiment)

As mentioned previously, in order to highly accurately perform a sampling operation, previous and subsequent stages of the sampling circuit must have high speed characteristics required to ensure over a considerably wide range the speed performance of the sampling circuit for the purpose of preventing the aperture effect. For example, in order to sample a signal of 1 MHz having a carrier wave of 100 MHz is sampled with an accuracy of 8 bits, the aperture time must be reduced to 13.67 ps or less. In order to provide such high speed characteristic to the sampling circuit, the capacitance of a capacitor for holding purpose must be reduced to several pF. As a result, the hold circuit including the hold capacitor is provided with high speed characteristics, and a circuit having a bandwidth of 100 MHz is used for extracting a signal having a bandwidth of 1 MHz.

Figure 9:
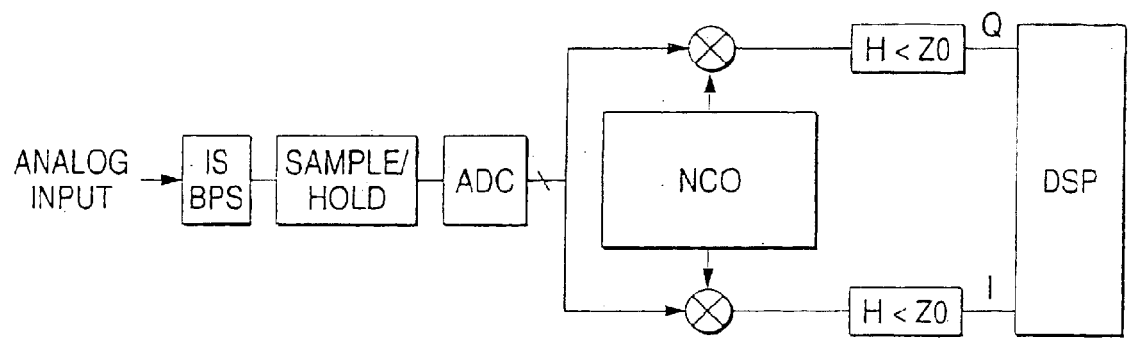
FIG. 9 is a block diagram showing the configuration of a radio section of an existing radio receiving system which uses a bandwidth-limited sampling method.

In other words, the bandwidth of the hold circuit becomes considerably wider than that of the received signal. In spite of a band pass filter being provided in a previous stage for the purpose of limiting the receiving signal to a predetermined bandwidth, the bandwidth of a circuit provided in a subsequent stage must become considerably wider than that of the band pass filter. The amount of thermal noise caused by the hold circuit becomes much larger than that caused in the existing receiver circuit, which in turn accounts for an increase in the error rate. Even an existing circuit used with an IF signal such as that shown in FIG. 9 has a disadvantage of a wide bandwidth of circuits following the hold circuit, as well as of an increase in thermal noise. A radio receiving system according to a second embodiment of the present invention is one which forms a channel filter by quantizing a received signal through sampling and by subjecting the thus-quantized signal to digitized signal processing operation. The radio receiving system comprises a sample-and-hold circuit for sampling and holding an output from a band pass filter which compensates for the aperture effect due to a sampling operation, and an integrating circuit having the function of integrating the received signal during a sampling period of the sample-and-hold circuit.

Figure 13:
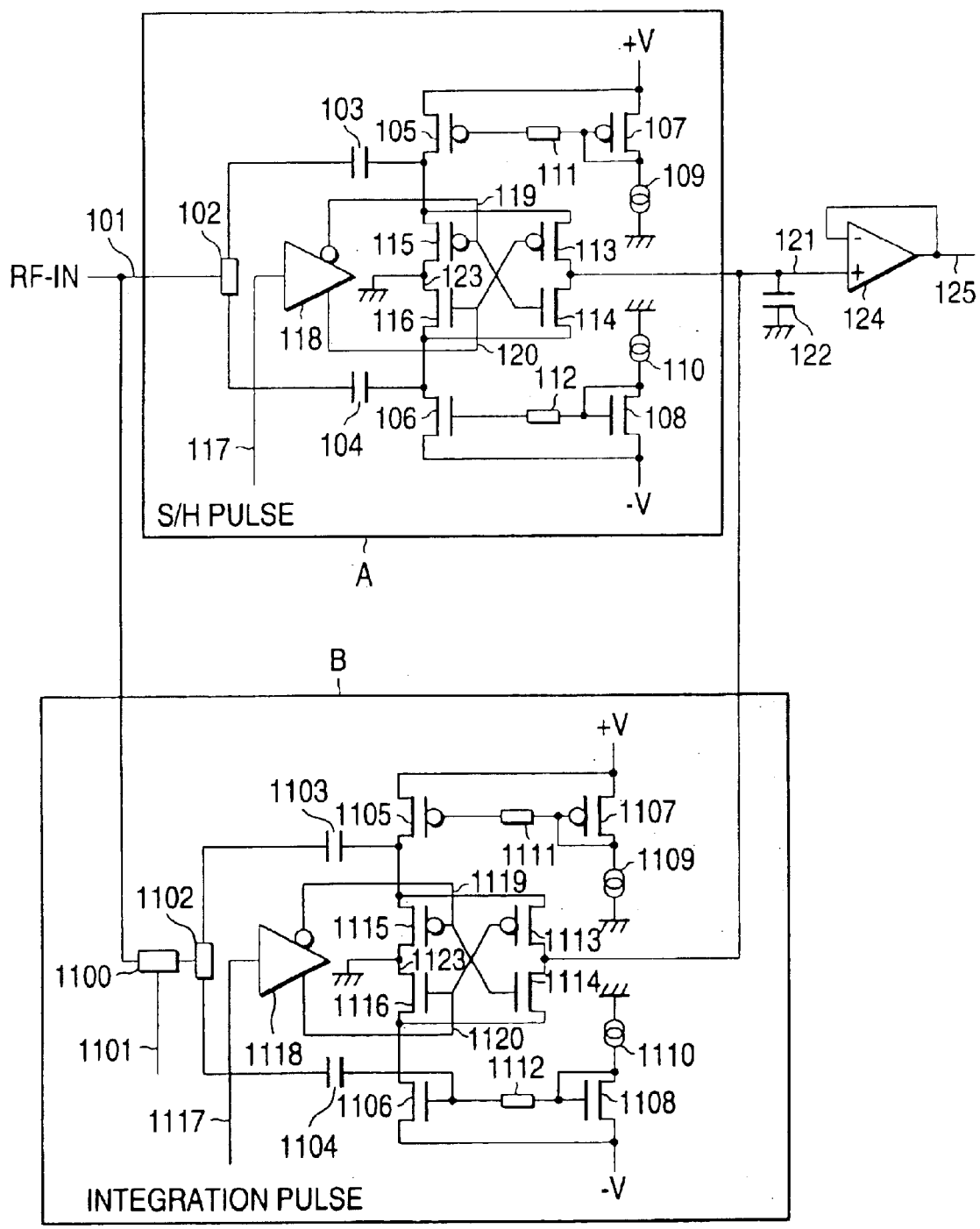
FIG. 13 is a circuit diagram showing a specific circuit configuration of a radio receiving system according to a second embodiment of the present invention.

FIG. 13 is a circuit diagram for explaining the radio receiving system according to a second embodiment of the present invention. As shown in FIG. 13, an integrating circuit having an integrating function is added to the sample-and-hold circuit 5 shown in FIG. 1 used for explaining the first embodiment of the present invention.

In FIG. 13, the radio receiving system according to the second embodiment comprises a sample-and-hold circuit A and an integrating circuit B. An input signal is supplied to the sample-and-hold circuit A and the integrating circuit B. In the sample-and-hold circuit A, an input signal 101 is divided into two signal components by a divider 102. The thus-divided two signals are amplified respectively by coupling capacitors 103 and 104 and are fed to amplifying transistors 105 and 106, respectively. Outputs from the amplifying transistors 105 and 106 are delivered to sample-and-hold switching transistors 113, 114 and 115, 116. Gate circuits 119 and 120 for the purpose of controlling the sample-and-hold switching transistors 113, 114 and 115, 116 are controlled by a sampling pulse amplifier 118 which receives as an input a sampling pulse signal 117.

Switching transistors 115, 116, and 1115, 1116, are typically connected to ground as shown in FIG. 13 at 123, 1123, respectively. The output of the output terminals of the sample-and-hold transistors 113 and 114 are connected together by means of an output line 121 connected to a hold capacitor 122. Output terminals of the switching transistors 115 and 116 is grounded, thus permitting flow of the input signal during a hold period. A terminal voltage of the hold capacitor 122 is increased by a buffer amplifier 124 and is output from a sample-and-hold output signal 125.

The amplifying transistors 105 and 106 are connected respectively to current mirror transistors 107 and 108 by way of buffer resistors 111 and 112. The current mirror transistors 107 and 108 receive a constant current from constant current power supplies 109 and 110. The sampling pulse signal 117 is assigned a waveform operation such as that shown in FIG. 14B.

In the integrating circuit B, the input signal 101 is supplied to an attenuator 1100, and the amount of attenuation of the attenuator 1100 is controlled by means of an attenuation control signal 1101. An output from the attenuator 1100 is divided into two signal components by a divider 1102. The thus-divided two signals are amplified respectively by coupling capacitors 1103 and 1104 and are fed to amplifying transistors 1105 and 1106, respectively. Outputs from the amplifying transistors 1105 and 1106 are delivered to sample-and-hold switching transistors 1113, 1114 and 1115, 1116.

Gate circuits 1119 and 1120 for the purpose of controlling the sample-and-hold switching transistors 1113, 1114 and 1115, 1116 are controlled by a sampling pulse amplifier 1118 which receives as an input an integration control signal 1117. Output terminals of the sample-and-hold transistors 1113 and 1114 are connected together by means of an output line 1121 connected to a hold capacitor 1122.

Output terminals of the switching transistors 1115 and 1116 is grounded, thus permitting flow of the input signal during a hold period. A terminal voltage of the hold capacitor 1122 is increased by the buffer amplifier 124 and is output from the sample-and-hold output signal 125. The amplifying transistors 1105 and 1106 are connected respectively to current mirror transistors 1107 and 1108 by way of buffer resistors 1111 and 1112. The current mirror transistors 1107 and 1108 receive a constant current from constant current power supplies 1109 and 1110. The integration control signal 117 is assigned a waveform operation such as that shown in FIG. 14C.

The sample-and-hold circuit A is different from the integrating circuit B in two points: First, they use different control signals. Second, the coupling capacitors 103 and 104 are connected to the drains of the corresponding amplifying transistors 105 and 106 and are directly connected to a bridge circuit comprising the transistors 113, 114, 115, and 116. In contrast, the coupling capacitors 1103 and 1104 are connected to the gates of the corresponding amplifying transistors 1105 and 1106 and are connected to a bridge circuit comprising the transistors 1113, 1114, 1115, and 1116 by way of the drains of the amplifying transistors 1105 and 1106.

As a result, with the circuit configuration formed from the coupling capacitors 103 and 104 and the amplifying transistors 105 and 106, the input signal 101 is supplied as a voltage signal to the bridge circuit comprising the transistors 113, 114, 115, and 116. The signals input from the coupling capacitors 1103 and 1104 are converted from voltage signals to current signals by means of the amplifying transistors 1105 and 1106, and the thus-converted current signals are supplied to the bridge circuit comprising the transistors 1113, 1114, 1115, and 1116.

Figures 14A, 14B, 14C:
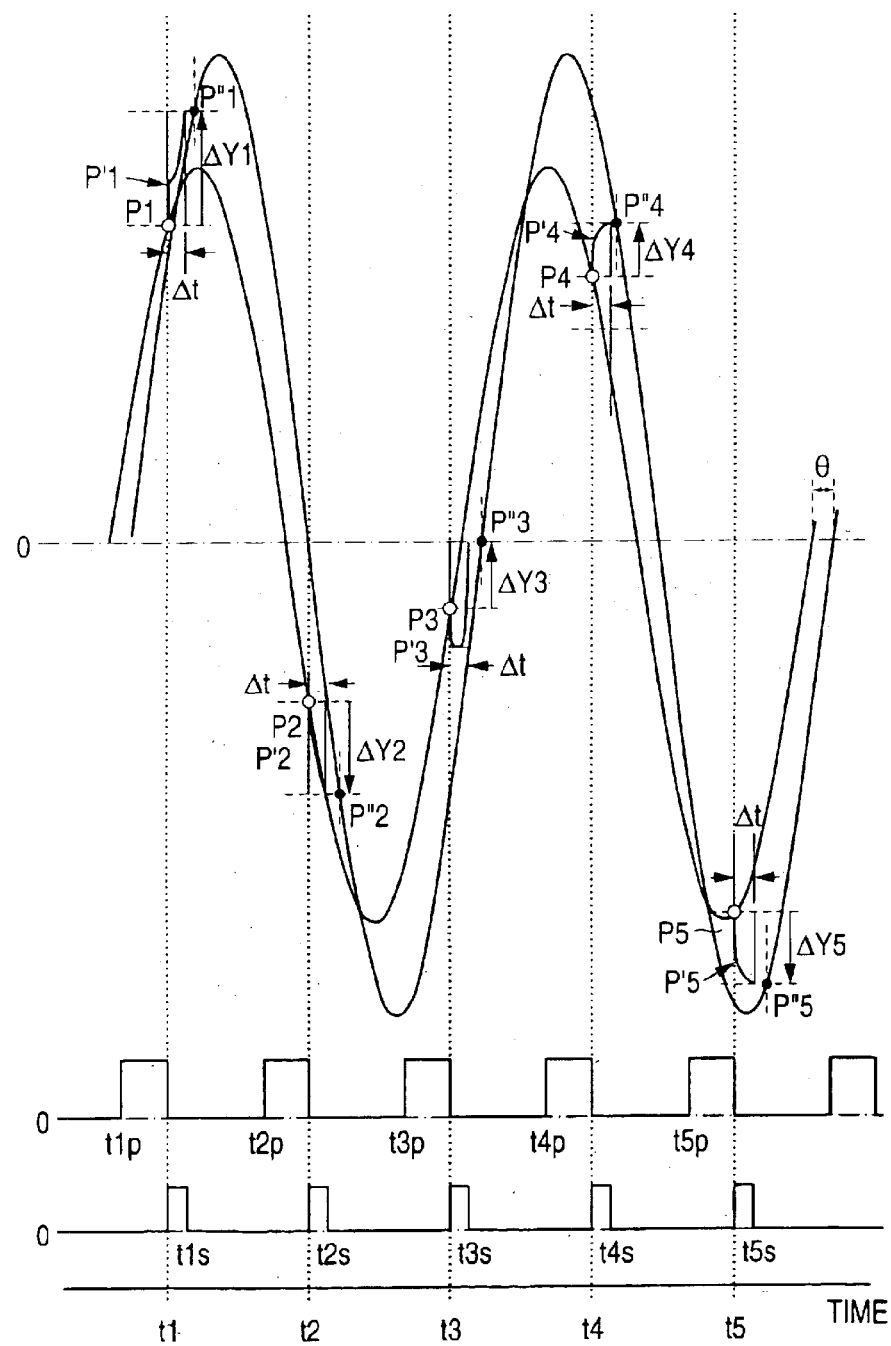
FIGS. 14A to 14C are plots for explaining the operation of the radio receiving system according to the second embodiment.

FIGS. 14A to 14C show the theory of operation of the radio receiving system according to the second embodiment of the present invention shown in FIG. 13. As shown in FIGS. 14A to 14C, the input signal is sampled at t1, t2, t3, t4, and t5. The sample-and-hold circuit A changes to an integrating state from a tracking state—in which the circuit is held immediately before the sampling timing—at times t1, t2, t3, t4, and t5.

As shown in FIGS. 14A to 14C, the tracking state is represented as intervals from t1p to t1, from t2p to t2, from t3p to t3, from t4p to t4, and from t5p to t5. The input signal is integrated during a period of Δt between t1 and t1s, that between t2 and t2s, that between t3 and t3s, that between t4 and t4s, and that between t5 and t5s.

The circuit operates on the basis of the same principle throughout operations, and hence the operation of the circuit at time t1 will be explained as an example. The sample-and-hold circuit A commences a tracking operation at time t1p and enters a hold state at time t1. The voltage of the input signal 101 at time t1 is P1, and a potential P'1 is received from a hold capacitor CH by way of the sample-and-hold circuit. Subsequently, the input signal 101 is converted into an electric current by means of the transistors 1105 and 1106 of the integrating circuit. During a period from t1 to t1p, the transistors 1113 and 1114 are brought into conduction, thus storing an electric current into the hold capacitor 122. In other words, the signal input to the integrating circuit from t1 to t1p is integrated, and the thus-obtained integrated value is superimposed on the potential P'1, thus producing a potential P"1. When the sample-and-hold operation and the integrating operation are performed, an electric potential expressed by Eq.7 is stored in the hold capacitor 122. When the integrating operation is performed, an electric potential expressed by Eq.8 is stored in the hold capacitor 122.

In like manner, Pn, P'n, and P"n are potentials as defined above at time tn, with n=1, 2, 3 . . . .

With a view to simplifying calculation, the input signal is expressed as a simple sine wave (i.e., having an amplitude of 1). Further, the relationship between the output from the sample-and-hold circuit A and the output from the integrating circuit B is controlled by the attenuator 1100 which controls the amount of attenuation through use of the attenuation control signal 1101.

(Terminal Voltage of Hold Capacitor)

$$=\cos 2\pi fc t(t=t1) + \int_{ct1+t1\Delta t} \cos 2\pi fc t\, dt$$

$$=\cos 2\pi fc t(t=t1) + [(1/2\pi fc)\sin 2\pi fc t]\, t1+\Delta t$$

$$=\cos 2\pi fc t1 + (1/2\pi fc)\{\sin 2\pi fc(t1+\Delta t) - \sin 2\pi fc\Delta t\} \quad (\text{Eq.7})$$

Assuming that a sampling point t1 is placed at the center of Δt and Δt is placed at 2 Δτ in order to simplify calculation, the foregoing expression will become (Terminal Voltage of Hold Capacitor)

$$=\cos 2\pi fc t1 + (1/2\pi fc)\{\sin 2\pi fc(t1+\Delta \tau) - \sin 2\pi fc(t1-\Delta \tau)\}$$

$$=\cos 2\pi fc t1 + (1/2\pi fc)\{\sin 2\pi fc t1 \cos 2\pi fc\Delta\tau + \cos 2\pi fc t1 \sin 2\pi fc\Delta\tau - \sin 2\pi fc t1 \cos 2\pi fc\Delta\tau + \cos 2\pi 1 \sin 2\pi fc\, \Delta\tau\}$$

$$=\cos 2\pi fc t1 + (1/\pi fc)\cos 2\pi fc t1 \sin 2\pi fc\Delta\tau$$

$$=\cos 2\pi fc t1\{1+(1/\pi fc)\sin 2\pi fc\Delta\tau\} \quad (\text{Eq.8})$$

In short, it is obvious that a variation of sin 2 πfc Δτ is added to an output of cos 2 πfct1 resulting from sampling of a voltage, by the neglect of the fact that an amplitude factor of 1/πfc vulnerable to a frequency is multiplied by the output of cos 2 πfct1. From this description, it can be decided that the input signal is not distorted within the range in which Δτ does not cause a quantization error in the input signal.

Since the actually input signal includes various interference waves or noise present in a limited bandwidth, consideration must be given to disturbance corresponding to a ratio of the carrier frequency to the bandwidth rather than to a simple sine wave. The value of disturbance is usually considered to be 0.1 or less, and hence the value can be substantially calculated by the foregoing equations. Accordingly, if a quantization accuracy is eight bits, the width of Δτ is set to 1/256 or less of one cycle of a data rate.

Assuming that the bandwidth of the first filter 2 that permits passage of only a signal a frequency band assigned to a communications system from which the radio receiving system receives a signal—is 1 MHz, Δτ can be extended to 1/256 of 1 μs, i.e., 4 ns or less.

The integration of the received signal has the effect of being able to integrating the energy of the desired waveform signal. Particularly, even in a case where a weak radio wave is received and a desired waveform signal is buried in thermal noise in a circuit, a sampling operation being performed at an ordinary voltage enables power to be produced from an input signal only during a period over which the aperture effect arises. However, the radio receiving system according to the present embodiment integrates the received signal while t e period of time during which the energy is integrated is extended, thus doubling power. Further, a random signal, such as thermal noise, cancels itself as a result of integration, enabling an improvement in a signal-to-noise ratio.

Compared with an ordinary sample-and-hold circuit, the sample-and-hold circuit according to the second embodiment enables the capacitance of the hold capacitor to be increased to such an extent as to correspond to a ratio of an aperture time to an integral action time, and hence the high frequency impedance of a terminal of the capacitor can be reduced to a considerably small value. Accordingly, mixing of noise and occurrence of thermal noise can be prevented.

For example, in the foregoing embodiment, the aperture time is 13.67 ps or less, and the integral action time is 4 ns or less. A ratio of aperture time to integral action time is 292.6. Although a hold capacitor having a capacitance of 0.3 pF or thereabouts is used for the existing sample-and-hold circuit, the capacitance of the capacitor can be increased to about 87.8 pF in the second embodiment. In short, an existing sample-and-hold circuit has a high impedance of 5.30 kilo ohms with respect to a signal having a bandwidth of 100 MHz, whereas the sample-and-hold circuit according to the present embodiment has a low impedance of 18.1 ohms with respect to the same signal. Assuming that noise is mixed into the input signal from a noise source having a signal-source impedance of 50 ohms by way of a stray capacitance of 1 pF, the hold capacitor having a capacitance of about 0.3 pH causes an attenuation of only −2.56 dB, but the hold capacitor having a capacitance of 87.7 pF causes an attenuation of −39.2 dB, thus reducing noise to 36 dB or more.

(Third Embodiment)

As represented by Eq.8, the carrier wave frequency fc of the received signal supplied to the sampling circuit and an integral action time Δt correspond to each other in a straightforward manner. For example, in a case where there is an increase in the received carrier wave frequency fc, in (Terminal Voltage of Hold Capacitor)

$$=\cos 2\pi fc t1\{1+(1/\pi fc)\sin 2\pi fc\Delta\tau\},$$

if an integral action period Δτ is not changed with regard to fc in the above equation, Δτ deviates from a desired value determined by quantization accuracy relative to one cycle of a data rate.

Consequently, in a case where consideration is given to a multiband-compatible radio receiving system: that is, where the sampling frequency is changed in order to correspond to a change in the carrier wave frequency or bandwidth of a received signal, if an integration constant is fixed, an output is driven to saturation or is decreased, impairing the originally expected function of the radio receiving system according to the present invention.

In a case where the sample-and-hold circuit is used while its sampling frequency is changed, if the sampling period $\Delta t$ is fixed, the expected effect of the second embodiment will be deteriorated as a matter of course.

For example, in a case where there is an increase in the carrier wave frequency fc of the received signal, the integral action period $\Delta\tau$ is changed so as to correspond to such an increase in the carrier wave frequency, the capacitance of CH in Eq.8: that is, (Terminal Voltage of Hold Capacitor)

$$=(1/2 \; \pi fcCH)\cos 2 \; \pi fct1\{1+(1/\pi fc)\sin 2 \; \pi fc\Delta\tau\},$$

must be changed, thus decreasing an integral output and hence deteriorating a signal-to-noise ration.

In order to solve the aforementioned problem, the integrating circuit used in the radio receiving system according to the second embodiment is arranged so as to enable the integral action time to be changed or selected from a plurality of values in the third embodiment.

Figure 16:
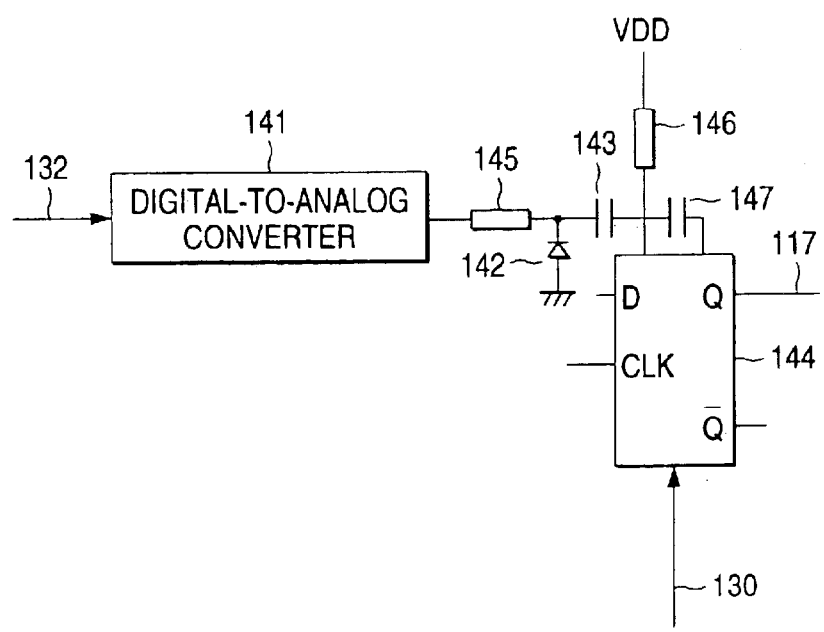
FIG. 16 is a circuit diagram showing the configuration of a variable delay device according to a third embodiment of the present invention.

FIG. 16 is a schematic diagram for explaining a radio receiving system according to the third embodiment of the present invention. A delay device shown in FIG. 16 is designed so as to make variable the width of the sampling pulse signal 117 to be applied to the sample-and-hold circuit which is shown in FIG. 13 and which is described for the second embodiment.

The circuit shown in FIG. 16, as a whole, constitutes a variable delay device which receives as an input signal a basic signal 130 and which produces the sampling pulse signal 117. The delay instruction signal 132 is supplied to the variable delay device in a digital form, and the delay device manages the degree of delay corresponding to working conditions and determines the length of the integral action time $\Delta t$.

More specifically, the variable delay device comprises a digital-to-analog converter 141 which receives the delay instruction signal 132, a variable capacity diode 142 which receives an output voltage from the digital-to-analog converter 141, a coupling capacitor 143 which transmits the electric charges stored in the variable capacity diode; and a monostable multivibrator 144 which integrates and stores the electric charge discharged from the capacitor.

Resistors 145, 146, and capacitor 147 are similarly connected as shown in FIG. 16.

Although the variable delay device can change the width of the sampling pulse signal by supplying the delay instruction signal 132 in the foregoing example, the sampling pulse itself may be selected from a plurality of sampling pulse signals.

With the foregoing configuration, the integral action time in the sample-and-hold circuit is changed according to a variation in the frequency or bandwidth of an input signal, thus realizing the desired effectiveness of integration.

(Fourth Embodiment)

In a case where consideration is given to a multiband-compatible radio receiving system: that is, where the sampling frequency is changed in order to correspond to a change in the carrier wave frequency or bandwidth of a received signal, there is necessity to change the integral action time of an integrating circuit added to the sample-and-hold circuit.

If the integration active time is changed while the integral capacity of the integrating circuit is fixed, an output is driven to saturation or is decreased, impairing the originally expected function of the radio receiving system. As represented by Eq.8, the carrier wave frequency fc of the received signal supplied to the sampling circuit and the integral capacity defined by an integral action time At correspond to each other in a straightforward manner. For example, in a case where there is an increase in the received carrier wave frequency fc, provided that the integral action period $\Delta\tau$ is changed so as to correspond to the increase in the frequency of the carrier waveform,
the capacitance CH in Eq.8, i.e.,
(Terminal Voltage of Hold Capacitor)

$$=(1/2 \; \pi fcCH)\cos 2 \; \pi fct1\{1+(1/\pi fc)\sin 2 \; \pi fc\Delta\tau\},$$

is not changed, an integral output is decreased, resulting in deterioration of a signal-to-noise ratio.

In order to solve the aforementioned problem, the integrating circuit used in the radio receiving system according to the third embodiment is arranged so as to enable the integral action time to be changed or selected from a plurality of values in the fourth embodiment.

Figure 17:
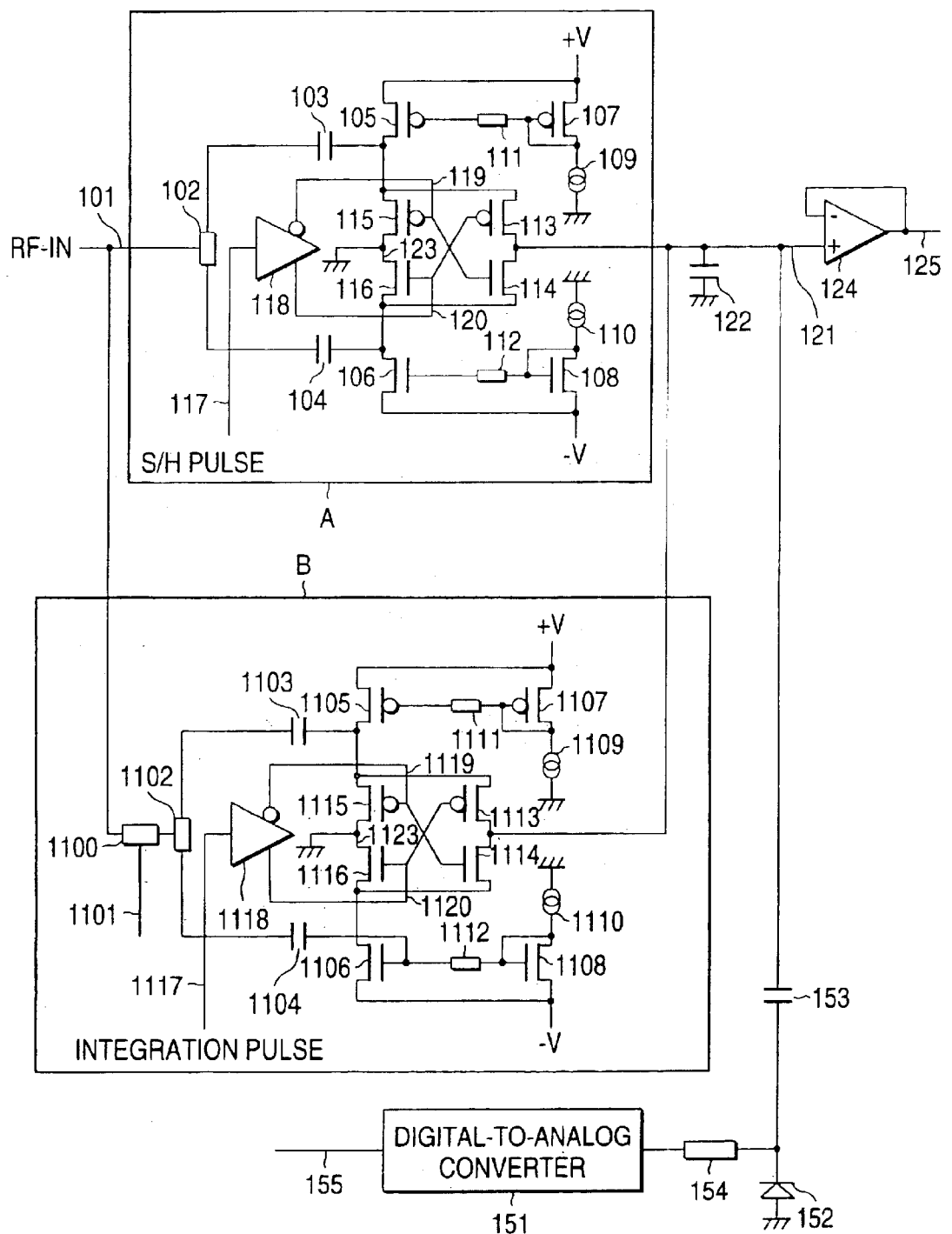
FIG. 17 is a circuit diagram showing a specific circuit configuration of a radio receiving system according to a fourth embodiment of the present invention.

FIG. 17 is a schematic diagram for explaining a radio receiving system according to the fourth embodiment of the present invention. FIG. 17 shows a variable capacitor added to the hold capacitor 122 of the sample-and-hold circuit 5 which is shown in FIG. 13 and which is described for the third embodiment.

The circuit shown in FIG. 17, as a whole, constitutes a variable hold capacitor. More specifically, the variable hold capacitor comprises a digital-to-analog converter 151 which receives an integration instruction signal 155, a variable capacity diode 152 which receives an output voltage from the digital-to-analog converter 151, a coupling capacitor 153 which transmits the electric charges stored in the variable capacity diode; and current coupling means 154 which connects the digital-to-analog converter 151 to the variable capacity diode 152.

With the foregoing configuration, the integral capacity of the sample-and-hold circuit is changed according to a variation in the frequency or bandwidth of an input signal, thus realizing the desired effectiveness of integration.

(Fifth Embodiment)

Although the method of providing the integrating circuit for reducing noise has been described in the second embodiment, no weighting is performed during the integral action time. Consequently, the accuracy of detection of a desired signal is decreased. For this reason, the integral action time is limited to the range defined by Eq.2. In other words, the integrating circuit is less effective in reducing low frequency noise outside the range.

Since the leading and trailing edges of the sampling pulse signal must be made steep, the amplifier which supplies a sampling signal is required to have a drive capacity and high speed performance. At the same time, unnecessary external radiation from the amplifier is apt to increase.

In order to solve the aforementioned problem, the integrating circuit used in the radio receiving system according to the second embodiment is arranged so as to provide an integral gate function with the waveform of a Nyquist signal in the fifth embodiment.

Figure 18:
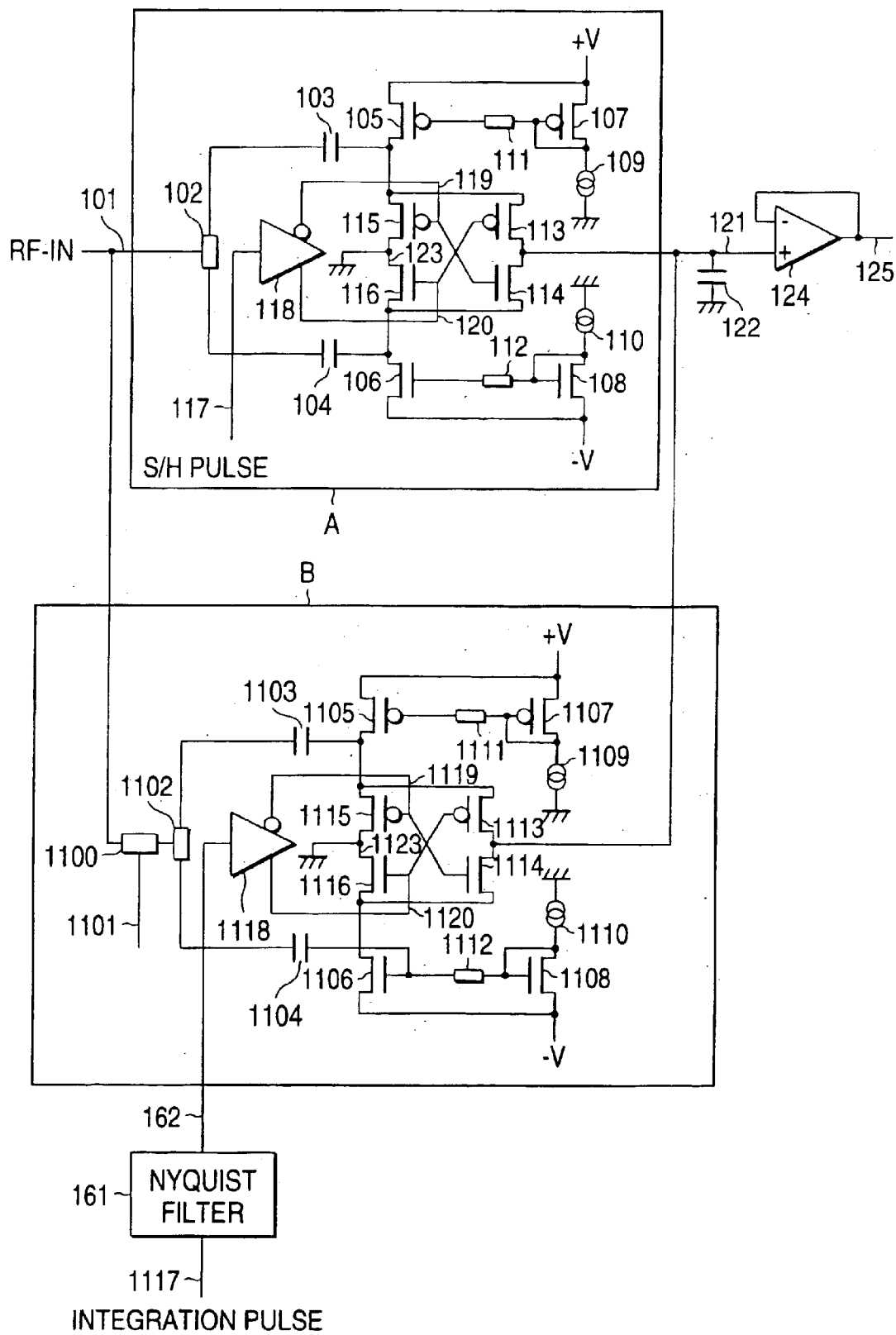
FIG. 18 is a circuit diagram showing a specific circuit configuration of a radio receiving system according to a fifth embodiment of the present invention.

FIG. 18 is a schematic diagram for explaining a radio receiving system according to the fifth embodiment of the present invention. The elements from the inputs signal 101 to the sample-and-hold output signal 125 are the same as those which are shown in FIG. 13 and which have been described for the second embodiment. The sampling pulse signal 117 is supplied to a Nyquist filter 161, and an output 162 from the Nyquist filter 161 is supplied to the sampling pulse amplifier 118.

Figure 19A:
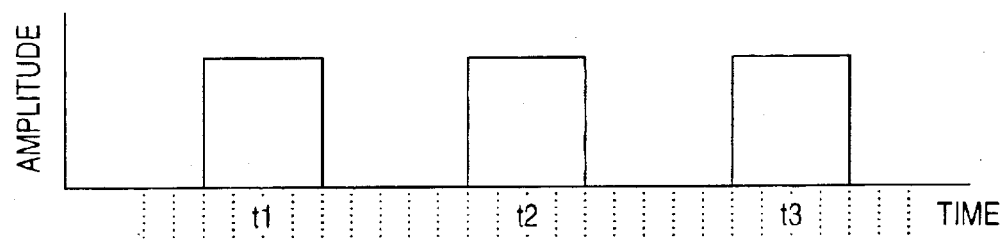
FIGS. 19A and 19B are timing charts for explaining the operation of the radio receiving system according to the fifth embodiment.
Figure 19B:
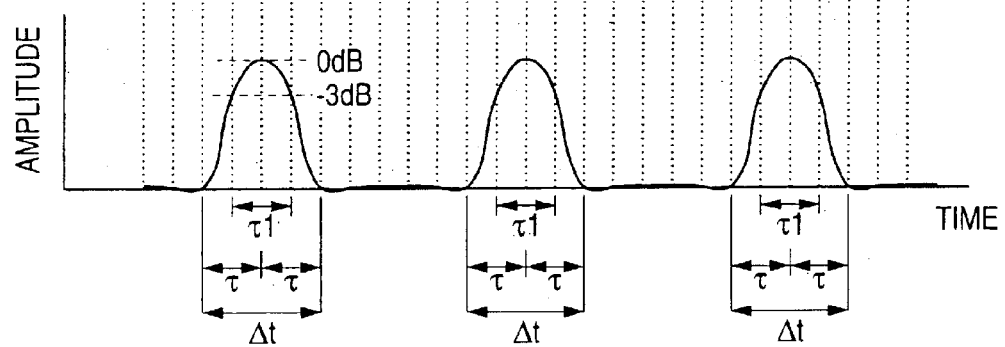

FIGS. 19A and 19B are timing charts for explaining operations of the sample-and-hold circuit shown in FIG. 18 through use of waveforms. FIG. 19A shows the waveform of the sampling pulse signal 117, and FIG. 19B shows an output 162 that has passed through the Nyquist filter 161.

A received signal is integrated on the basis of the Nyquist signal shown in FIG. 19B. More specifically, the received signal is integrated as a result of having passed through a window formed by the waveform of the Nyquist signal. A period during which transmission pulse power becomes half the original power, i.e., the sample-and-hold period, is taken as τ1, the integral action time is taken as Δt in the manner analogous to that mentioned previously, and Δt is expressed as 2τ.

In a case where a Nyquist waveform i-s expressed in the form of a normal distribution waveform, there will be obtained a relationship such as 3τ 1_ ... Δt. In short, a total of integral action time is approximately 1.5 times as longer as that required by the circuit according to the second embodiment. Within 67% of the integral action time, the circuit acquires 99% of power of the received signal. Further, substantially all the pulse frequency components are concentrated at a frequency of ½τ, thus preventing higher harmonic waves which would otherwise occur over the high frequency portion of an ordinary pulse signal.

With the foregoing configuration, an efficient sample-and-hold circuit—which has an integrating function and which provides a higher signal-to-noise ratio—can be realized.

(Sixth Embodiment)

In any one of the sample-and-hold circuits having the integrating circuits according to the second through fifth embodiments, the integrating circuit has integral action time which is shorter than the cycle of a carrier signal of the received signal. For this reason, the integrating circuit cannot sufficiently eliminate a random signal, such as thermal noise, from low-frequency components.

A sixth embodiment of the present invention is directed toward solving the foregoing problem and is characterized by the feature that the time constant of the sample-and-hold circuit of the radio receiving system according to the second or third embodiment is made longer than a sampling cycle.

Figure 20:
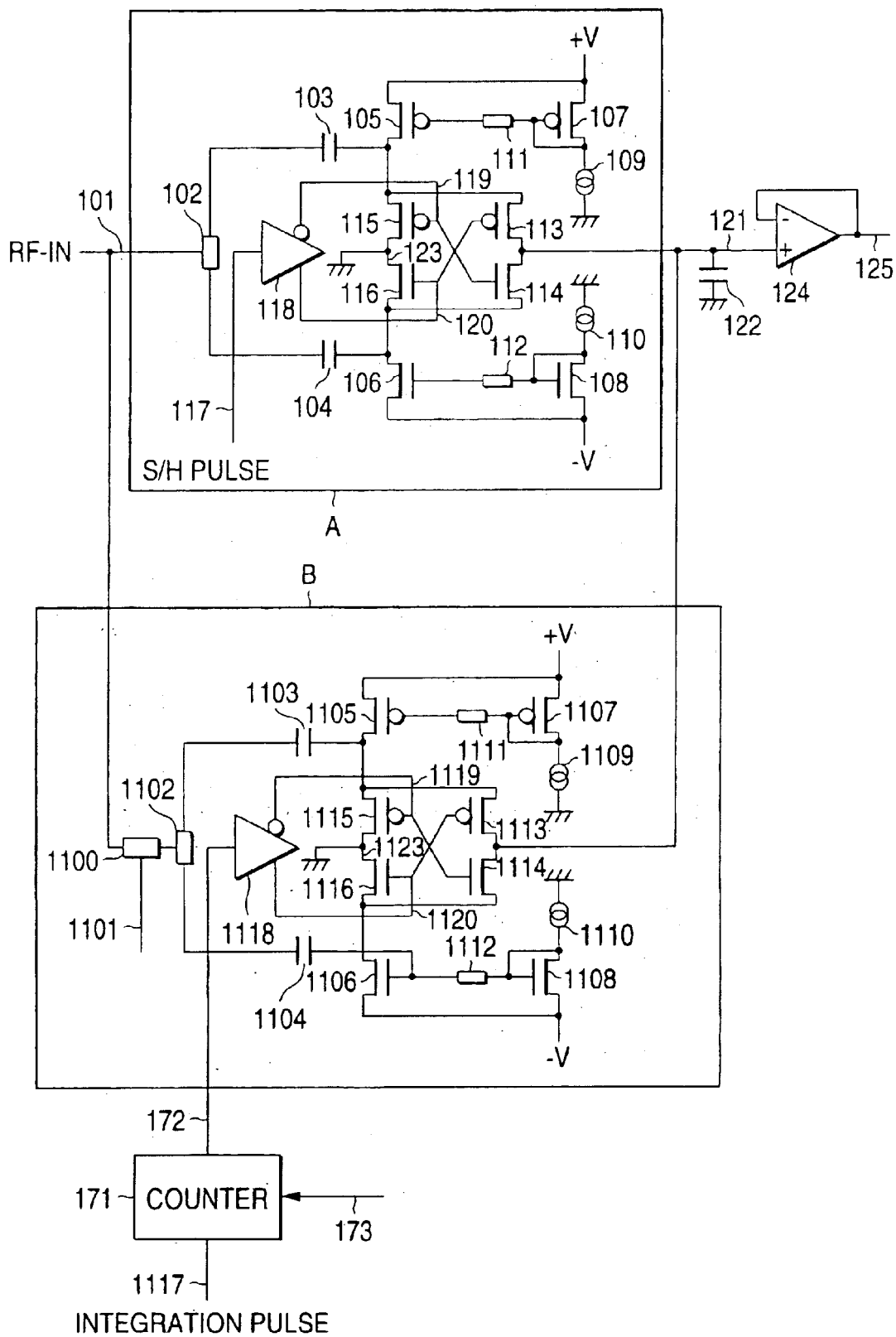
FIG. 20 is a circuit diagram showing a specific circuit configuration of a radio receiving system according to a sixth embodiment of the present invention.

FIG. 20 is a schematic diagram for explaining a radio receiving system according to the sixth embodiment of the present invention. Turning to FIG. 20, the elements from the inputs signal 101 to the sample-and-hold output signal 125 are the same as those which are shown in FIG. 13 and which have been described for the second embodiment. The system comprises a sampling pulse signal 1117, a counter 171 for receiving the sampling pulse signal, a long cycle sample-and-hold signal 172 output from the counter 171, and a control signal 173 for providing the counter 171 with an instruction relating to the number of counts. An explanation of a reset signal system will be omitted. Exemplary operations of the radio receiving system are shown in FIGS. 21A and 21B. FIG. 21A shows the sampling pulse signal 1117, and FIG. 21B shows an output from the counter 117. The principle of the radio receiving system will be illustrated in FIG. 22.

The sampling pulse signal 1117 shown in FIG. 20 arrives at even intervals t1n, t2n, t3n, . . . , tn-1n, tnn, tnm3, . . . , tm-1m, tmm, . . . at the counter 171 in the manner as shown in FIG. 21A. Upon receipt of the control signal 173, the counter 171 produces a long cycle pulse which causes an integrating operation during a period of n-pulses and holds the signal during a period of m-pulses. The thus-produced long cycle signal is the long cycle sample-and-hold signal 172. Namely, the sample-and-hold signal becomes H at tin and returns to H at tmm. The sample-and-hold signal repeatedly performs a round of these operations. As a result, the cycle of the long cycle sample-and-hold signal 172 is increased to (n+m) times as long as that of the sampling pulse signal 1117. Such a state of the sample-and-hold signal is expressed in the form of frequency characteristics.

The curve of characteristics shown in FIG. 22 represents the frequency characteristics of an output when the received signal is sampled at a sampling frequency fs: that is, generally-called sampling characteristics. The frequency characteristics of the output are expressed by $\{\sin(\pi f/fs)\}/(\pi f/fs)$, given that a d.c. range is taken as a relative amplitude of 1.

In general, the input frequency band width of the sampling frequency is determined so as to attenuate δa within the range of quantization error. The sixth embodiment of the present invention is characterized by a spectral wave appearing between a frequency position which is four times as high as the sampling frequency fs and a frequency position which is five times as high as the same: that is, by use of a spectral wave appearing between 4 fs and 5 fs. The peak of the spectral wave of sampling characteristic appears at a frequency position of about 4.5 fs, and a level of the spectral wave at the peak An+m is about 0.05. It is obvious that a frequency range fBW within a quantization accuracy of δb can be utilized with reference to the peak of the spectral wave. In other words, the relationship between the frequency fc of the received signal to be sampled and the sampling frequency fs is defined as 4.5:1; the curve of sampling characteristics such as that shown in FIG. 22 is obtained. Although a sampled output is attenuated to 0.05 in the present example, noise is integrated at a long cycle which is 4.5 times as long as that of noise. Accordingly, depending on properties of noise, the foregoing sampling operation is very effective in reducing noise. Further, a diminution in sampling frequency contributes to a reduction in the power dissipated by the sample-and-hold circuit and peripheral devices connected thereto.

(Seventh Embodiment)

In the second through sixth embodiments, a signal component substantially in a d.c. range is sampled. Even if a sample output is subjected to an a.c. coupling operation, it is difficult to remove the d.c. information components extracted by sampling. Consequently, it is difficult to eliminate unwanted components, such as temperature drift of the sampling circuit or a d.c. offset of an input circuit.

A seventh embodiment has been conceived to solve the foregoing problem and provides a radio receiving system in which a channel filter is formed by quantizing a received signal through sampling and by subjecting the thus-quantized signal to a digitized-signal processing operation, the system comprising: sampling means which is made of a sample-and-hold circuit and which samples the received signal; difference calculation means for calculating a difference between a currently-sampled signal received from the sample-and-hold circuit and a previously-sampled signal; and means for calculating a difference between the output from the difference calculation means and an output from the band pass filter and inputs the thus-obtained difference to the sample-and-hold circuit.

Figure 23:
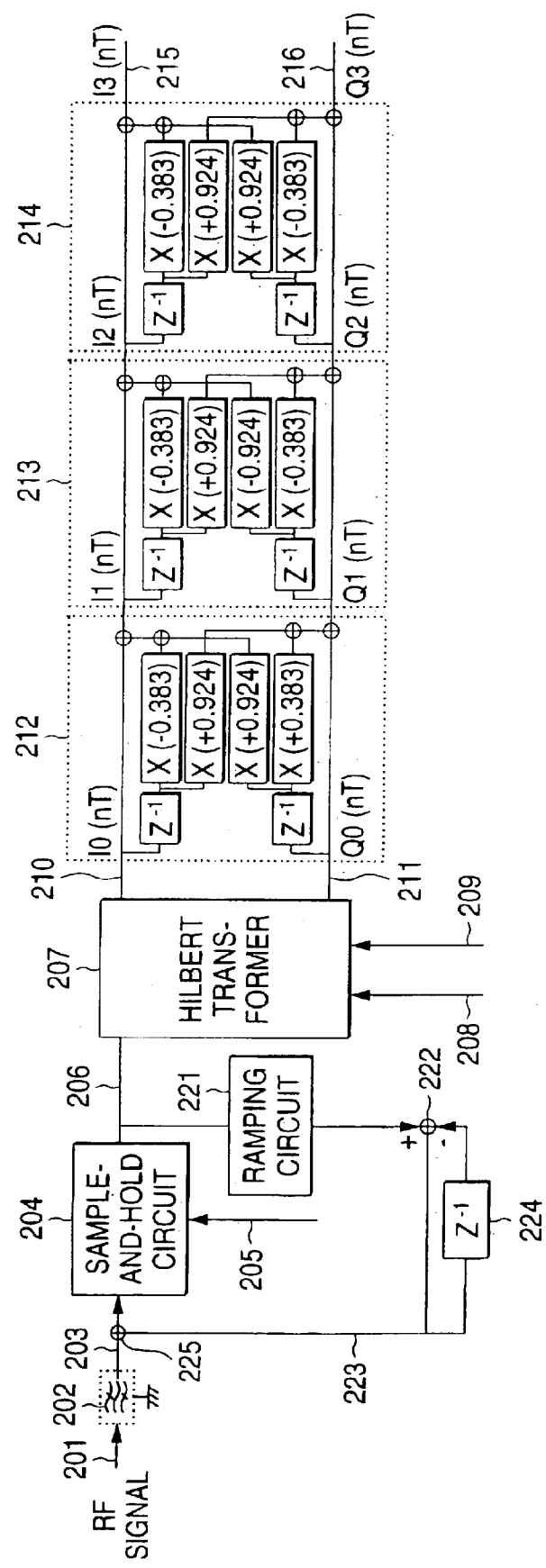
FIG. 23 is a block diagram showing the configuration of a receiver circuit of a radio receiving system according to a seventh embodiment of the present invention.

FIG. 23 is a circuit diagram for explaining a radio receiving system according to a seventh embodiment. In FIG. 23, the following elements are the same as those shown in FIG. 2: that is, the RF signal 201, the band pass filter 202, the output 203 from the band pass filter 202, the sample-and-hold circuit 204, the sample-and-hold signal 205, the sample-and-hold circuit output 206, the Hilbert transformer circuit 207, the clock signal 298 for Hilbert transformation purpose, the initial phase control signal 209 for Hilbert transformation purpose, the Hilbert-transformed I output 210, the Hilbert-transformed Q output 211, the complex coefficient filter I 212, the complex coefficient filter II 213, the complex coefficient filter III 214, the output 215 from the complex coefficient filter I, and the output 216 from the complex coefficient filter Q. Although the initial phase control signal 209 is supplied to the Hilbert transformer 207, this signal is intended to control reset inputs to the flip-flops U3 and U4 shown in FIG. 11 so as to obtain I=0 and Q=0.

The configuration of elements newly added to the radio receiving system according to the present invention will be described with reference to FIG. 23. Elements newly added to the circuit shown in FIG. 23 are a ramping circuit 221 for gently transmitting the influence of an incoming burst-like signal at an initial stage to subsequent circuits, a first subtracter 222, an output 223 from the first subtracter 222, a data delay device 224, and a second subtracter 225.

The ramping circuit 221 receives a burst-like an output from the sample-and-hold circuit 206 and supplies the thus-received signal to the first subtracter 222 by way of the ramping circuit 221. Upon receipt of the output 223 from the first subtracter 222, the delay device 224 supplies the previously-sampled data set to the first subtracter 222 while the sign of the data set is reversed. Accordingly, the output 223 from the first subtracter 222 is gradually changed so as to indicate the mean d.c. potential of the sample-and-hold circuit output 206. The output 223 which indicates the mean d.c. potential is supplied to the second subtracter 225, where a mean d.c. potential is removed from the output 203 from the band pass filter 202.

From the foregoing descriptions, it is evident that the foregoing circuit is effective in removing a d.c. component contained in a sample output produced when the sample-and-hold circuit samples a received signal including d.c. components or originally-unwanted components mixed in the sample output such as temperature drift of the sample-and-hold circuit or d.c. offset of the input circuit.

(Eighth Embodiment)

Although the I signal and the Q signal are alternately input to the first subtracter 222 in the seventh embodiment, unnecessary calculation of a d.c. level is performed every four data sets, and hence d.c. levels of the I and Q signals irrelevant to each other are compared with each other with regard to two data sets prior to and subsequent to data sets of interest.

To solve the foregoing problem, a radio receiving system according to an eighth embodiment of the present invention in which a channel filter is formed by quantizing a received signal by sampling and by subjecting the thus-quantized signal to a digitized-signal processing operation, comprising: sampling means which is made of a sample-and-hold circuit and which samples the received signal; Hilbert transformation means which produces rectangular components from the sample output from the sample-and-hold circuit; difference calculation means for calculating a difference between one of the rectangular components received from the transformation means and a previously-sampled rectangular component of the same type; and means for calculating a difference between the output from the difference calculation means and an output from the band pass filter and inputs the thus-obtained difference to the sample-and-hold circuit.

Figure 24:
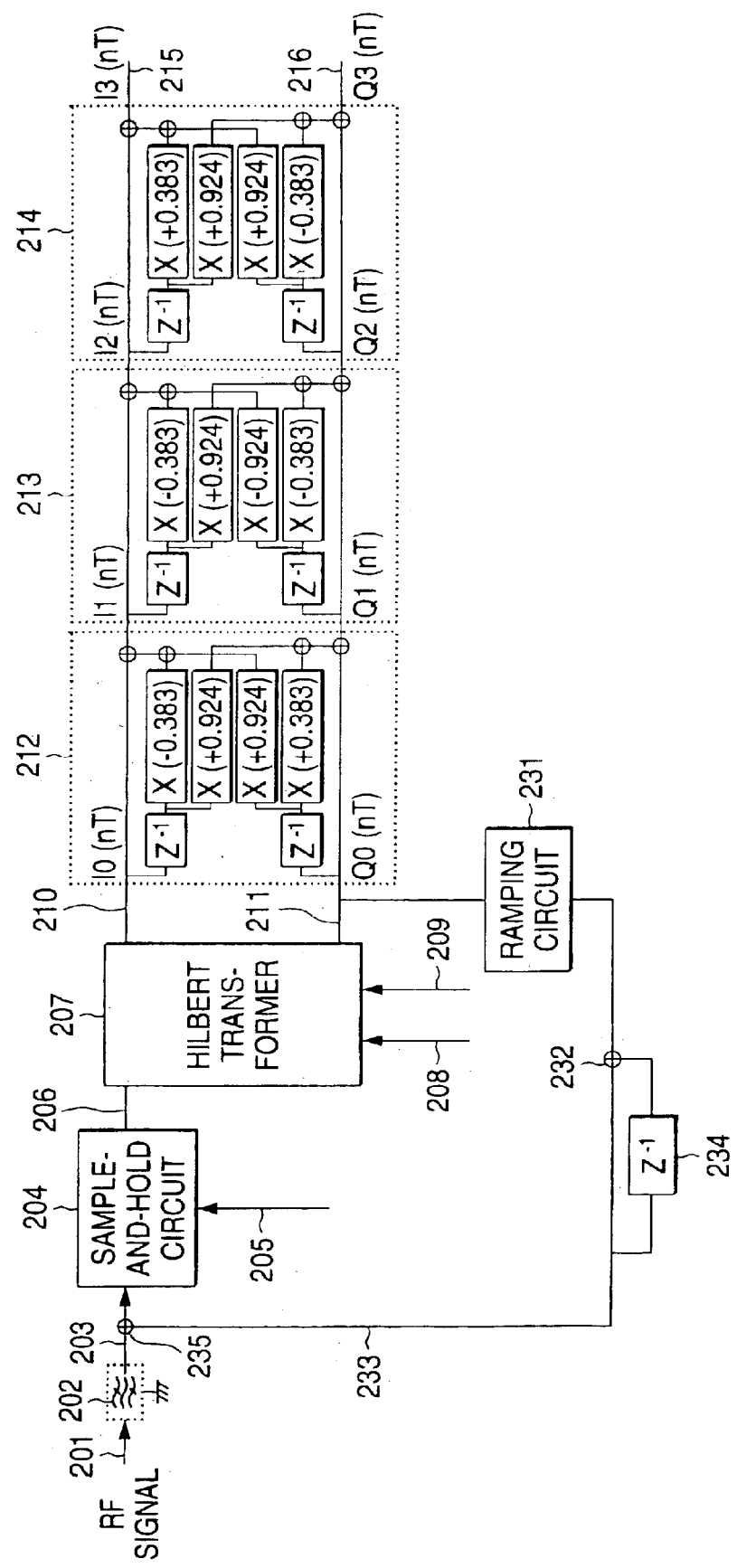
FIG. 24 is a block diagram showing the configuration of a receiver circuit of a radio receiving system according to an eighth embodiment of the present invention.

FIG. 24 is a circuit diagram for explaining a radio receiving system according to a seventh embodiment. In FIG. 23, the following elements are the same as those shown in FIG. 2: that is, the RF signal 201, the band pass filter 202, the output 203 from the band pass filter 202, the sample-and-hold circuit 204, the sample-and-hold signal 205, the sample-and-hold circuit 206, the Hilbert transformer circuit 207, the clock signal 208 for Hilbert transformation purpose, the initial phase control signal 209 for Hilbert transformation purpose, the Hubert-transformed I output 210, the Hilbert-transformed Q output 211, the complex coefficient filter I 212, the complex coefficient filter II 213, the complex coefficient filter III 214, the output 215 from the complex coefficient filter I, and the output 216 from the complex coefficient filter Q. Although the initial phase control signal 209 is supplied to the Hilbert transformer 207, this signal is intended to control reset inputs to the flip-flops U3 and U4 shown in FIG. 11 so as to obtain I=0 and Q=0.

The configuration of elements newly added to the radio receiving system according to the present invention will be described with reference to FIG. 23. Elements newly added to the circuit shown in FIG. 23 are a ramping circuit 221 for gently transmitting the influence of an incoming burst-like signal at an initial stage to subsequent circuits, a first subtracter 222, an output 223 from the first subtracter 222, a data delay device 224, and a second subtracter 225.

The ramping circuit 221 receives a burst-like an output from the sample-and-hold circuit 206 and supplies the thus-received signal to the first subtracter 222 by way of the ramping circuit 221. Upon receipt of the output 223 from the first subtracter 222, the delay device 224 supplies the previously-sampled data set to the first subtracter 222 while the sign of the data set is reversed. Accordingly, the output 223 from the first subtracter 222 is gradually changed so as to indicate the mean d.c. potential of the sample-and-hold circuit output 206. The output 223 which indicates the mean d.c. potential is supplied to the second subtracter 225, where a mean d.c. potential is removed from the output 203 from the band pass filter 202.

From the foregoing descriptions, it is evident that the foregoing circuit is effective in removing a d.c. component contained in a sample output produced when the sample-and-hold circuit samples a received signal including d.c. components or originally-unwanted components mixed in the sample output such as temperature drift of the sample-and-hold circuit or d.c. offset of the input circuit.

(Eighth Embodiment)

The I signal and the Q signal are alternately input to the first subtracter 222 in the seventh embodiment. More specifically, the d.c. level of the input signal must be calculated every four data sets. The d.c. level of a data set before the input signal and that of the input signal and the d.c. level of a data set subsequent to the input signal and that of the input signal are compared with each other.

To solve the foregoing problem, an eighth embodiment is directed to a radio receiving system in which a channel filter is formed by quantizing a received signal through sampling and by subjecting the thus-quantized signal to a digitized-signal processing operation, further comprising:

sampling means which is made of a sample-and-hold circuit and which samples the received signal;

Hilbert transformation means which produces rectangular components from the sample output from the sample-and-hold circuit;

difference calculation means for calculating a difference between one of the rectangular components received from the transformation means and a previously-sampled rectangular component of the same type; and means for calculating a difference between the output from the difference calculation means and an output from the band pass filter and inputs the thus-obtained difference to the sample-and-hold circuit.

FIG. 24 is a circuit diagram for explaining a radio receiving system according to an eighth embodiment. In FIG. 24, the following elements are the same as those shown in FIG. 2 or 23: that is, the RF signal 201, the band pass filter 202, the output 203 from the band pass filter 202, the sample-and-hold circuit 204, the sample-and-hold signal 205, the sample-and-hold circuit output 206, the Hilbert transformer circuit 207, the clock signal 298 for Hilbert transformation purpose, the initial phase control signal 209 for Hilbert transformation purpose, the Hilbert-transformed I output 210, the Hilbert-transformed Q output 211, the complex coefficient filter I 212, the complex coefficient filter II 213, the complex coefficient filter III 214, the output 215 from the complex coefficient filter I, and the output 216 from the complex coefficient filter Q.

The configuration of elements newly added to the radio receiving system according to the present invention will be described with reference to FIG. 24. Elements newly added to the circuit shown in FIG. 24 are a ramping circuit 231 for gently transmitting the influence of an incoming burst-like signal at an initial stage to subsequent circuits, a first subtracter 232, an output 233 from the first subtracter 232, a data delay device 234, and a second subtracter 235.

The Hilbert-transformed I output 210 or the Hilbert-transformed Q output 211 is supplied to the first subtracter 232 via the ramping circuit 231. Upon receipt of the output 233 from the first subtracter 232, the delay device 234 supplies the previously-sampled data set to the first subtracter 232 while the sign of the data set is reversed. Accordingly, the output 233 from the first subtracter 232 is gradually changed so as to indicate the mean d.c. potential of the sample-and-hold circuit output 206. The output 233 which indicates the mean d.c. potential is supplied to the second subtracter 235, where a mean d.c. potential is removed from the output 203 from the band pass filter 202. Since the signal is specified to either the I or Q signal, the result of calculation is not wasted.

From the foregoing descriptions, it is evident that the foregoing circuit responds exactly and is effective in removing a d.c. component contained in a sample output produced when the sample-and-hold circuit samples a received signal including d.c. components or originally-unwanted components mixed in the sample output such as temperature drift of the sample-and-hold circuit or d.c. offset of the input circuit.

(Ninth Embodiment)

Under the direct conversion receiving method, there is a need to provide a base band circuit with a function as a substitute for a channel filter which is conventionally provided in an IF stage of the existing receiver. To this end, it is also necessary for an HF stage whose filtering is insufficient to maintain a wide dynamic range and a wide bandwidth. Still further, there is a need for a filter which filters a signal having such a wide dynamic range and a bandwidth.

FIGS. 7A to 7C show the theoretical characteristics of the channel filter composed of two sets of cascaded three-stage complex coefficient filters. The foregoing channel filter including the three-stage complex coefficient filter causes an attenuation of −125 dB or more at the center frequency of the adjacent waveform. Even in the boundary region between the adjacent waveforms, there is achieved an attenuation of −25 dB. In other words, in view of the bandwidth of the channel frequency, four channels can be ensured between the image frequencies formed in the sampling waveform. A very efficient filter having superior symmetry can be realized by connecting tandem the channel filters, each including the foregoing complex coefficient filter, and by diminishing the sampling frequency to a quarter of the original sampling frequency in a subsequent stage.

FIG. 7A shows the frequency characteristics of the preliminary channel filter including the complex coefficient filter shown in FIG. 2 when the filter is activated at an oversampling frequency whose bandwidth is 64 times as wide as a frequency bandwidth. FIG. 7B shows the frequency characteristics of the channel filter—which includes a subsequent three-stage complex coefficient filter having the same structure as that shown in FIG. 4D—when the filter is activated at a frequency whose bandwidth is 16 times as wide as that of the frequency bandwidth. FIG. 7C shows synthetic characteristics obtained when these two channel filters are connected tandem. It is obvious from the characteristics shown in FIG. 7C that 16 channels are ensured between the sampling frequencies. It is also evident that the amount of signal passing through the channel filter is attenuated to −30 dB or more in the boundary region between the next adjacent waveform and the adjacent waveform after the next and that the signal is attenuated to −60 dB in the boundary between the seventh adjacent waveform and the eighth adjacent waveform. As a matter of course, it is obvious that a null point occurs in the filter at the center frequency of the adjacent waveform and that there arises an attenuation of −125 dB or more.

From the foregoing descriptions, it is clear that the preliminary channel filter including the three-stage complex coefficient filter activated at a 64-times oversampling frequency has the dominant effect of attenuating the adjacent waveforms spaced frequencies away from the desired waveform.

Figure 25:
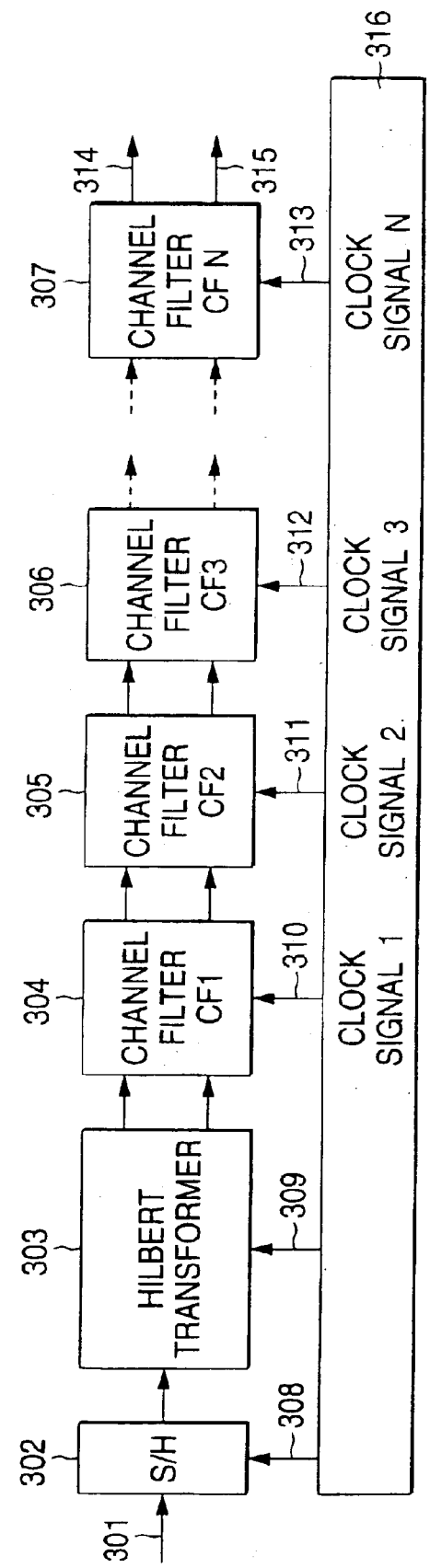
FIG. 25 is a block diagram showing the configuration of a receiver circuit of a radio receiving system according to a ninth embodiment of the present invention.

A ninth embodiment of the present invention has been conceived to solve the aforementioned problem. FIG. 25 is a block diagram for explaining the ninth embodiment. In an integrated circuit including elements which are manufactured with limited accuracy, the precision of a preliminary channel filter activated in a prioritized manner through high-order sampling is improved. As a result, the effect of attenuating an adjacent waveform spaced frequencies away from the desired waveform is more efficiently improved. A channel filter circuit provided in a subsequent stage can receive a signal of desired waveform from only the vicinity of which adjacent waveform signals of strong level are removed, i.e., a signal whose dynamic range is reduced to a lower level. Consequently, if a channel filter provided on a subsequent stage is inferior in precision to a channel filter provided on a preceding stage, or if the subsequent channel filter has the insufficient capability of eliminating an adjacent waveform of great level, the radio receiving system becomes less apt to suffer from a problem.

(Tenth Embodiment)

Note that the input 301 is input to the sample-and-hold circuit 302, which has an input to the Hilbert transformer 303, which then has two outputs to the first channel filter 304, which feeds the second channel filter 305, which feeds the third channel filter 306, etc., to finally feed an nth channel filter 307, and thus provide outputs 314, 315. The circuit 316 provides clock signals 308–313 to the corresponding components.

In the case of the integrated circuit which includes elements manufactured with limited accuracy and which is described for the ninth embodiment, it is not easy to improve the precision of a preliminary channel filter activated in a prioritized manner through high-order sampling. The reason for this is that, in a case where a received signal is received in the form an analog discrete signal and the thus-received signal is calculated through use of an analog circuit, means which determines the accuracy of calculation is determined by the precision of manufacture of a circuit device. It is impossible for all the circuit devices to achieve accuracy equivalent to −60 dB or a high accuracy of greater than 1/1000. For example, in the case of an analog circuit, with a view to realizing high accuracy through use of a switched capacitor, it is required to manufacture the capacitor with high accuracy of 1/1000 or greater. In the case of a common capacitor, the greater the areas of opposing metal plates become greater, the higher the accuracy of manufacture of the capacitor is increased. In short, when a capacitor having smaller electrostatic capacitance is manufactured, the accuracy of manufacture of the capacitor is decreased.

Since the complex coefficient filters do not have the same coefficient, as a matter of course, there is a need for a capacitor having small electrostatic capacitance. In other words, the accuracy of calculation is dominantly determined by an error in the capacitance of the capacitor having the minimum electrostatic capacitance.

Since a preliminary channel filter activated at a high-order oversampling frequency responds to a sampling operation higher than that to which a subsequent channel filter responds, there is a need for the preliminary filter having smaller capacitance than that of the subsequent filter. In short, the capacitor of the preliminary channel filter is required to have capacitance smaller than that of the capacitor of the subsequent channel filter.

A tenth embodiment of the present invention has been conceived to solve the foregoing problem. More specifically, with a view to realizing a capacitor having small capacitance and improved accuracy, the capacitor is realized by connecting in series capacitors having capacitance greater than that of the desired capacitor. In short, the dimensional accuracy of the capacitor is improved through use of a capacitor which can be manufactured with high accuracy, and a capacitor having smaller capacitance is realized by connecting in series a plurality of capacitors whose dimensional accuracy can be ensured. FIGS. 26A and 26B show their examples. These drawings are intended to explain a radio receiving system according to a tenth embodiment of the present invention. FIG. 26A is a schematic representation for explaining the principle on which an error arises during manufacture of a capacitor, and FIG. 26B is a schematic representation showing the principle of the tenth embodiment.

FIG. 26A-1 shows the shape of an electrode used in manufacturing a capacitor having capacitance Co.

FIG. 26A-2 shows the shape of an electrode used in manufacturing a capacitor having capacitance nCo.

Provided that n=9, that the electrodes shown in FIGS. 26A-1 and 26A-2 are geometrically similar to each other, and that the dimensional accuracy of manufacture of a capacitor is expressed as an absolute quantity ±δ, both the electrode shown in FIG. 26A-1 and the electrode shown in FIG. 26A-2 have an error of ±δ, and a capacitance ratio of the electrode shown in FIG. 26A-1 to the electrode shown in FIG. 26A-2 is "n." The ratio of one side of the electrode shown in FIG. 26A-1 to that of the electrode shown in FIG. 26A-2 corresponds to the square of "n." In the case of n=9, the root square of 9 is three. Provided that the electrode shown in FIG. 26A-1 has an error of 30%, the electrode shown in FIG. 26A-2 has an error of 30/3. Given that the electrode has a square shape, the electrode shown in FIG. 26A-1 has an area error of $(1\pm 0.3)^2$ and has an error of ±0.1. The electrode shown in FIG. 26A-2 has an area error of $(1\pm 0.3/3)^2$ and has an error of ±0.01. It is obvious that the error ratio of the electrode shown in FIG. 26A-1 to the electrode shown in FIG. 26A-2 is 10:1.

FIG. 26B-1 shows one capacitor and FIG. 26B-2 shows n-capacitors whose total capacitance is the same as that of the capacitor shown in FIG. 26B-1, wherein "n" is nine. Given that the capacitance of the capacitor shown in FIG. 26B-1 is Co, that the capacitance of each of the capacitors shown in FIGS. 26B-2 is $C_1$, $C_2$, $C_3$, $C_4$, $C_5$, $C_6$, $C_7$, $C_8$, $C_9$, and that $C_1=C_2=C_3=C_4=C_5=C_6=C_7=C_8=C_9$, $9C_o=C_1$. As can be seen from FIG. 26A, although the electrostatic capacitance of the capacitor shown in FIG. 26B-1 has an error of ±10%, the error in the electrostatic capacitance of the capacitor shown in FIG. 26B-2 is reduced to ±1%.

As mentioned previously, the frequency characteristics of the first filter (i.e., a band pass filter)—for the purpose of permitting passage of only a signal at a frequency band assigned to a communications system from which the radio receiving system according to the first embodiment receives a signal—are set so as to become opposite to the aperture effect due to a sampling operation. The band pass filter having such characteristics can be readily realized through use of a SAW (surface acoustic wave) filter.

What is claimed is:

1. A radio receiving system for receiving an input signal in a direct conversion receiving mode and for providing a desired waveform, the system comprising:

a first complex coefficient channel filter; and a second complex coefficient channel filter connected in series with, and after, the first channel filter, wherein the first channel filter is more precise than the second channel filter such that a center frequency of the first channel filter corresponds more accurately with a frequency of the desired waveform than a center frequency of the second channel filter.

2. The radio receiving system of claim 1, further comprising a third complex coefficient channel filter connected in series with, and after, the second channel filter, wherein one or both of the first and the second channel filter are more precise than the third channel filter such that a center frequency of said one or both of the first channel filter and the second channel filter corresponds more accurately with a frequency of the desired waveform than a center frequency of the third channel filter.

3. The radio receiving system defined in claim 1 wherein the bandwidth of the first channel filter is the same as the bandwidth of the second channel filter.

4. The radio receiving system defined in claim 1 wherein the center frequency of the second channel filter is offset from the center frequency of the first channel filter by a frequency corresponding to a baseband frequency.

5. The radio receiving system defined in claim 1 further comprising a third channel filter having a center frequency different from the center frequency of the first channel filter and the center frequency of the second channel filter.

6. A radio receiving system for receiving an input signal in a direct conversion receiving mode, the system comprising:

a first complex coefficient channel filter; and a second complex coefficient channel filter connected in series with, and after, the first channel filter, wherein the first channel filter is more precise than the second channel filter such that a center frequency of the first channel filter corresponds more accurately with a frequency of the signal than a center frequency of the second channel filter.

7. The radio receiving system of claim 6, further comprising a third complex coefficient channel filter connected in series with, and after, the second channel filter, wherein one or both of the first and the second channel filter are more precise than the third channel filter such that a center frequency of said one or both of the first channel filter and the second channel filter corresponds more accurately with a frequency of the signal than a center frequency of the third channel filter.

8. A radio receiving system for receiving a signal in a direct conversion receiving mode, said system comprising:

a plurality of cascaded channel filters, wherein each channel filter includes a complex coefficient filter, wherein a center frequency of a preliminary channel filter of said cascaded channel filters is adapted to correspond more closely with the frequency of the signal than a center frequency of a subsequent channel filter of said cascaded channel filters, and wherein, the preliminary channel filter includes a plurality of series-connected capacitors, each of said plurality of capacitors manufactured having a high dimensional precision, thereby resulting in a lower total capacitance with a high total precision, for improving the accuracy of operation of the preliminary channel filter when compared with that of the subsequent channel filter.

* * * * *

UNITED STATES PATENT AND TRADEMARK OFFICE
CERTIFICATE OF CORRECTION

PATENT NO. : 6,922,454 B2
DATED : July 26, 2005
INVENTOR(S) : Gen-ichiro Ohta et al.

It is certified that error appears in the above-identified patent and that said Letters Patent is hereby corrected as shown below:

Column 5,
Line 49, delete "filer", and insert -- filter --.

Column 7,
Line 52, delete "to", and insert -- t0 --.

Column 11,
Line 52, delete "Of", and insert -- of --.

Column 17,
Lines 47-48, delete "cos 2 Πfct1+(1/2Πfc){sin 2 Πfct1 cos 2 ΠfcΔT+cos 2 Πfct1 sin 2 ΠfcΔT-sin 2 Πfct1 cos 2 ΠfcΔT+cos 2 Π1 sin 2 Πfc ΔT}", and insert -- cos 2 Πfct1+(1/2Πfc){sin 2 Πfct1 cos 2 ΠfcΔT+cos 2 Πfct1 sin 2 ΠfcΔT-sin 2 Πfct1 cos 2 ΠfcΔT+cos 2 Πfct1 sin 2 Πfc ΔT} --.

Column 18,
Line 1, delete "2 that", and insert -- 2-that --.
Line 15, delete "while t e period", and insert -- while the period --.

Column 19,
Line 67, delete "At", and insert -- Δt --.

Column 21,
Line 12, delete "i-s", and insert -- is --.
Line 64, delete "tin", and insert -- t1n --.

Column 22,
Line 66, delete "298", and insert -- 208 --.

UNITED STATES PATENT AND TRADEMARK OFFICE
CERTIFICATE OF CORRECTION

PATENT NO. : 6,922,454 B2
DATED : July 26, 2005
INVENTOR(S) : Gen-ichiro Ohta et al.

It is certified that error appears in the above-identified patent and that said Letters Patent is hereby corrected as shown below:

Column 24,
Line 5, delete "Hubert", and insert -- Hilbert --.

Signed and Sealed this

Second Day of May, 2006

JON W. DUDAS
*Director of the United States Patent and Trademark Office*